(12) United States Patent
Hosono et al.

(10) Patent No.: US 7,180,787 B2
(45) Date of Patent: Feb. 20, 2007

(54) SEMICONDUCTOR MEMORY DEVICE

(75) Inventors: Koji Hosono, Yokohama (JP);
Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/929,572

(22) Filed: Aug. 31, 2004

(65) Prior Publication Data

US 2005/0213385 A1  Sep. 29, 2005

(30) Foreign Application Priority Data

Mar. 29, 2004  (JP) ............................. 2004-094893

(51) Int. Cl.
*G11C 11/34* (2006.01)
(52) U.S. Cl. .................... 365/185.24; 365/185.14; 365/185.18; 365/185.02; 365/185.11; 365/185.17; 365/185.26
(58) Field of Classification Search ........... 365/185.24, 365/185.14, 185.18, 185.02, 185.11, 185.26, 365/185.17
See application file for complete search history.

(56) References Cited

U.S. PATENT DOCUMENTS

| | | | | |
|---|---|---|---|---|
| 5,740,107 A | * | 4/1998 | Lee ...................... | 365/185.11 |
| 5,812,454 A | * | 9/1998 | Choi ..................... | 365/185.17 |
| 5,995,417 A | * | 11/1999 | Chen et al. ............ | 365/185.29 |
| 6,031,764 A | * | 2/2000 | Imamiya et al. ....... | 365/185.29 |
| 6,353,242 B1 | * | 3/2002 | Watanabe et al. ...... | 257/316 |
| 6,531,773 B2 | * | 3/2003 | Nishizawa et al. ..... | 257/723 |
| 6,574,161 B2 | * | 6/2003 | Ooishi ................... | 365/226 |
| 6,657,892 B2 | * | 12/2003 | Sakui et al. ........... | 365/185.14 |
| 6,768,163 B2 | * | 7/2004 | Tanaka et al. ......... | 257/319 |
| 6,801,458 B2 | * | 10/2004 | Sakui et al. ........... | 365/185.24 |
| 6,807,099 B2 | * | 10/2004 | Hosono et al. ........ | 365/185.19 |
| 6,839,269 B2 | * | 1/2005 | Iwata et al. ............ | 365/158 |
| 6,839,283 B1 | * | 1/2005 | Futatsuyama et al. .. | 365/185.23 |
| 6,862,223 B1 | * | 3/2005 | Lee et al. .............. | 365/185.33 |
| 6,891,757 B2 | * | 5/2005 | Hosono et al. ........ | 365/185.19 |
| 6,922,364 B2 | * | 7/2005 | Kojima .................. | 365/185.33 |
| 2002/0196672 A1 | | 12/2002 | Honma et al. | |
| 2005/0213385 A1 | | 9/2005 | Hosono et al. | |

FOREIGN PATENT DOCUMENTS

| | | |
|---|---|---|
| JP | 11-219595 | 8/1999 |
| JP | 2003-208793 | 7/2003 |

OTHER PUBLICATIONS

U.S. Appl. No. 11/495,463, filed Jul. 31, 2006, Futatsuyama.
U.S. Appl. No. 10/929,572, filed Aug. 31, 2004, Hosono et al.

\* cited by examiner

*Primary Examiner*—Viet Q. Nguyen
(74) *Attorney, Agent, or Firm*—Oblon, Spivak, McClelland, Maier & Neustadt, P.C.

(57) ABSTRACT

A semiconductor memory device includes: a memory cell array having word lines and bit lines disposed to cross each other, and memory cells disposed at crossings thereof; a controller configured to control operations of the memory cell array; and a word line drive circuit configured to set at least one of unselected word lines in an electrically floating state while driving a selected word line, based on input address and control signals output from said controller.

16 Claims, 22 Drawing Sheets

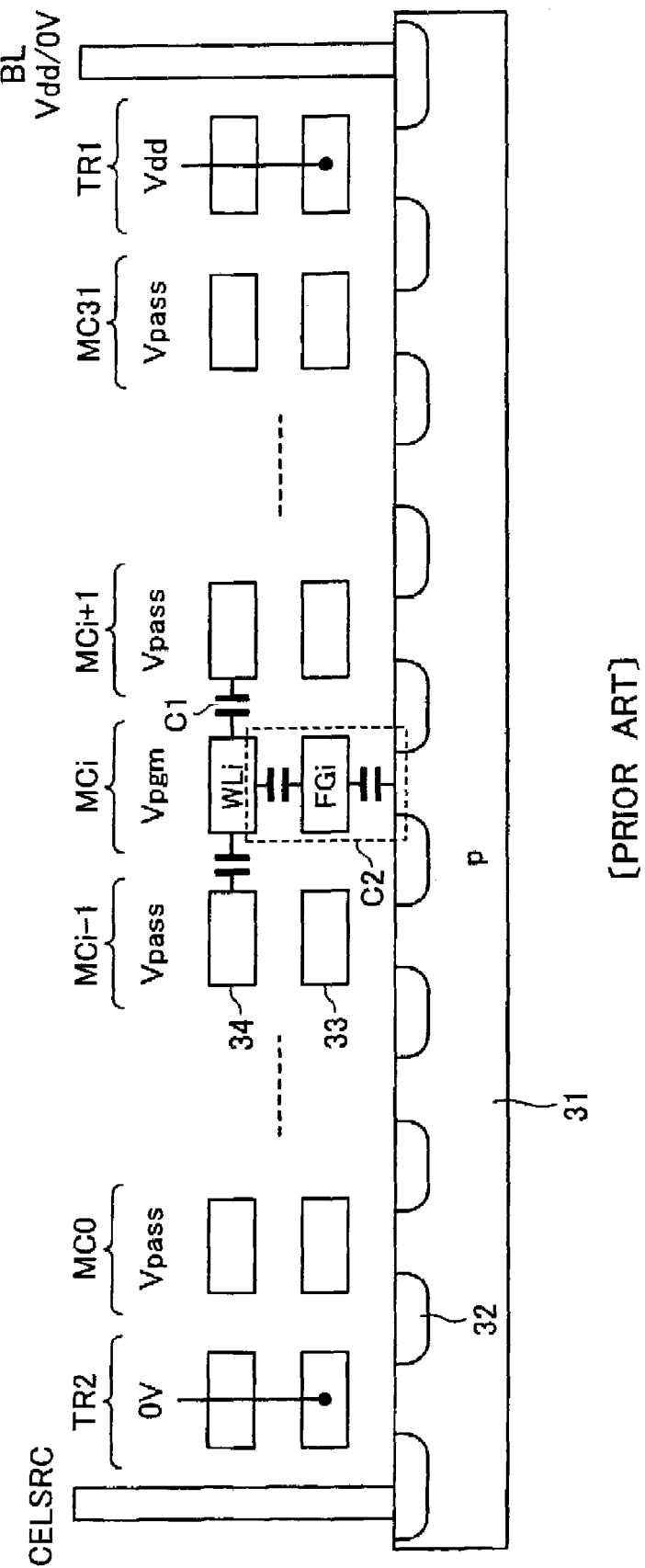
FIG. 20 [PRIOR ART]

SEMICONDUCTOR MEMORY DEVICE

CROSS-REFERENCE TO RELATED APPLICATION

This application is based on and claims the benefit of priority from the prior Japanese Patent Application No. 2004-094893, filed on Mar. 29, 2004, the entire contents of which are incorporated herein by reference.

BACKGROUND OF THE INVENTION

1. Field of the Invention

This invention relates to a semiconductor memory device, especially relates to a word line drive scheme which is able to achieve a high-speed performance thereof.

2. Description of Related Art

A NAND-type flash memory is known as one of electrically rewritable and non-volatile semiconductor memory devices (EEPROMs). FIG. 20 shows a schematic sectional view of a NAND cell unit, i.e., a basic unit of the NAND-type flash memory. The NAND cell unit is formed of plural memory cells MC0–MC31 connected in series and two select transistors TR1 and TR2. One of the select transistors, TR1, is coupled to a bit line BL, and the other, TR2, to a source line CELSRC disposed common to a memory cell array.

One memory cell has N-type diffusion layers 32 serving as source/drain layers and a stacked gate structure with a floating gate 33 and a control gate 24 stacked thereabove. The control gate 34 is elongated as a word line common to plural memory cells arranged in the direction perpendicular to the section of FIG. 20. This memory cell stores a threshold voltage state defined by the amount of charge in the floating gate as one-bit data or two-bit data in a non-volatile manner. The cell data is rewritable by use of erase and write operations.

FIG. 20 shows a voltage application state at a data write time. Write voltage Vpgm (about 20V) is applied to a selected word line WLi, and write pass voltage Vpass (about 10V) is applied to the remaining unselected (or non-selected) word lines. The select transistors TR1 and TR2 are normal transistors without floating gate. Applied to the select transistor TR1 disposed at the bit line BL side is a voltage equal to or less than a power supply voltage Vdd, and applied to the select transistor TR2 disposed at the source line CELSRC side is 0V. The above-described voltage application state is disclosed, for example, in Published Unexamined Japanese Patent Application No. 2003-208793.

Write data will be applied to the bit lines BL. In detail, 0V and Vdd are applied to the corresponding bit lines in accordance with write data "0" and "1", respectively. In case of "0" data writing, 0V applied to the bit line BL is transferred to the channel of the selected memory cell MCi, and a voltage of about 20V is applied between the word line WLi and the channel. Therefore, electrons are injected into the floating gate FGi by FN tunneling, thereby resulting in that the threshold voltage of the selected memory cell MCi is shifted to the positive direction. By contrast, in case of "1" data writing (i.e., write inhibition), the select transistor TR1 is cut off when Vdd−Vt (where, Vt is a threshold voltage of the select transistor) is transferred to the channel. Therefore, when the write voltage Vpgm is applied to the selected word line, the floating channel is boosted in potential by capacitive coupling. As a result, FN tunneling current is not carried in the selected memory cell MCi, and the threshold voltage thereof is not varied.

The write voltage pulse application operation will be repeated plural times with a write verify operation for verifying a write state at each cycle in a practical data write sequence. It is required of the NAND-type flash memory to control the "0" write cell's threshold as to be in a voltage region with an upper limit of a certain value lower than a read pass voltage Vread. For this purpose, having confirmed by a write verify operation after write pulse application that a selected memory cell's threshold is over a targeted threshold, the selected memory cell is exchanged hereinafter from a "0" write mode to a "1" write mode in the successive write sequence. That is, the write sequence will be controlled as to continue the write operation only for "0" write memory cells, threshold voltages of which have not yet reached the targeted threshold voltage.

Since data write of the NAND-type flash memory is performed by use of FN tunneling current, it is possible to simultaneously write in a range of a page length with 512-Byte, 2k-Byte or the like. Therefore, the NAND flash memory has a feature that not only it is easy to achieve a memory system with a large capacity, but also data write is done at a substantially great rate. For example, one of the specifications in practical NAND-type flash memories is defined as follows: logical page length is 2k-Byte; and write rate is about 10MB/sec in case of two-value data storing and about 3MB/sec in case of four-value data storing.

Although it is required of a NAND-type flash memory to have an increased capacity and an improved write rate further in future, there is a problem to be solved that a word line has a large CR delay. If the design rule is shrunk in accordance with memory capacity increasing, there is a possibility that the word line becomes to have a CR delay larger than the former one, rather than it is decreased. It is desirable to decrease the word line resistance and/or the wiring capacitance by process improvement, but it is not easy.

For the purpose of high-rate data write, it may be taken some measures on circuitry such as: to shorten the clock cycle of an internal sequencer, which is used for sequence-controlling data write or erase, in correspondence with the chip ability; and to shorten the pulse width in each write pulse application operation. However, with respect to shortening the write pulse width, if over-shortening it, the net time of the write pulse application is decreased, thereby resulting in that the write voltage must be increased. Further, in case the word line delay is large, the write voltage variation on the word line becomes large as dependent on the position of the word line, thereby causing the write rate to be greatly varied as dependent on the position of the word line. Even if the write pulse application time is shortened, this not always leads to improvement of the write performance because of that not only the write voltage becomes high on the average, but also numerous write pulse application operations and write-verify operations are required.

SUMMARY OF THE INVENTION

According to an aspect of the present invention, there is provided a semiconductor device including:

a memory cell array having word lines and bit lines disposed to cross each other, and memory cells disposed at crossings thereof;

a controller configured to control operations of the memory cell array; and a word line drive circuit configured to set at least one of unselected word lines in an electrically floating state while driving a selected word line, based on input address and control signals output from said controller.

BRIEF DESCRIPTION OF THE DRAWINGS

FIG. 20 shows a voltage application state in a conventional NAND-type flash memory.

DETAILED DESCRIPTION OF THE EMBODIMENTS

Illustrative embodiments of this invention will be explained with reference to the accompanying drawings below.

[Embodiment 1]

Figure 1:
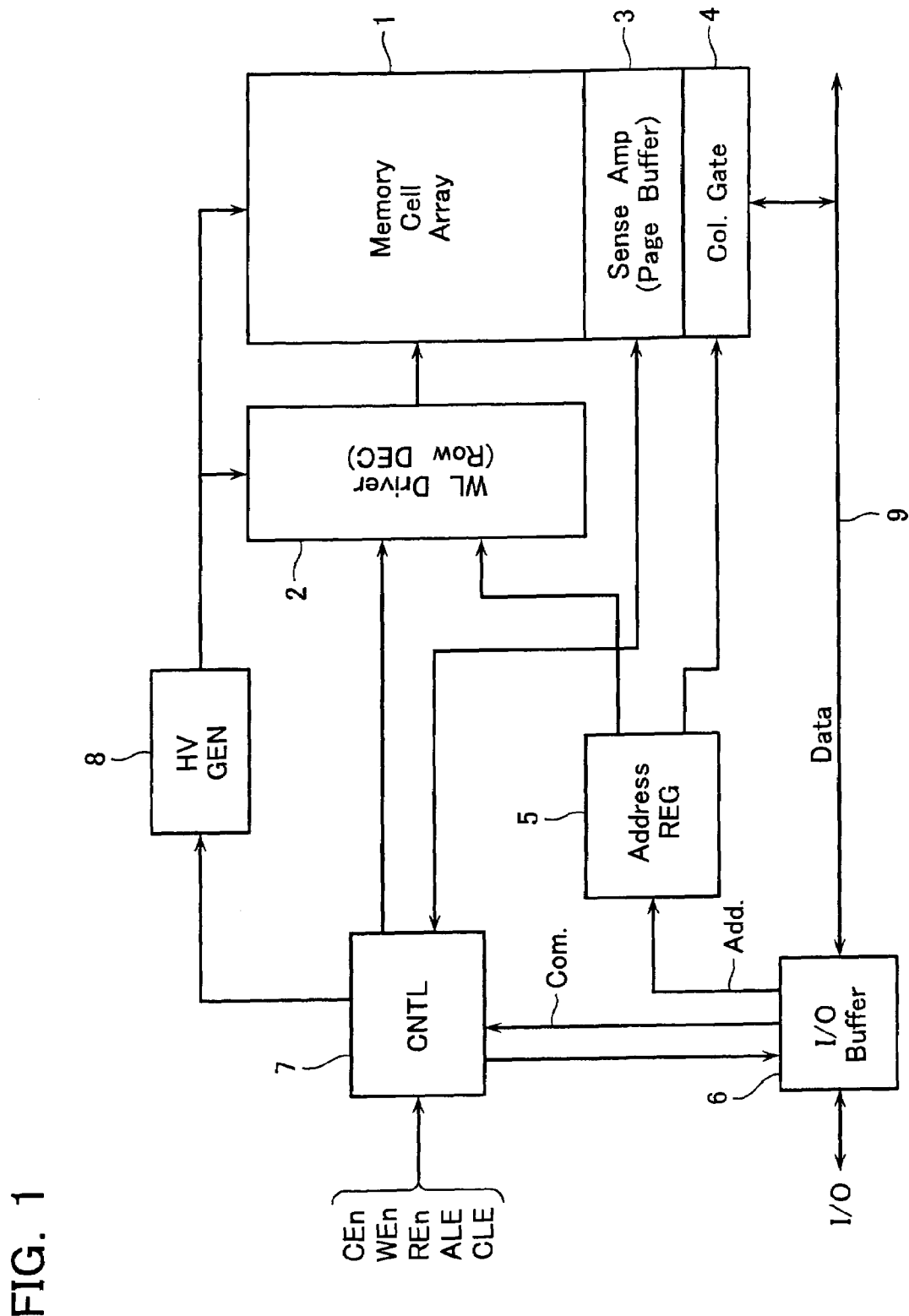
FIG. 1 shows a functional block configuration of a flash memory in accordance with an embodiment of the present invention.
Figure 2:
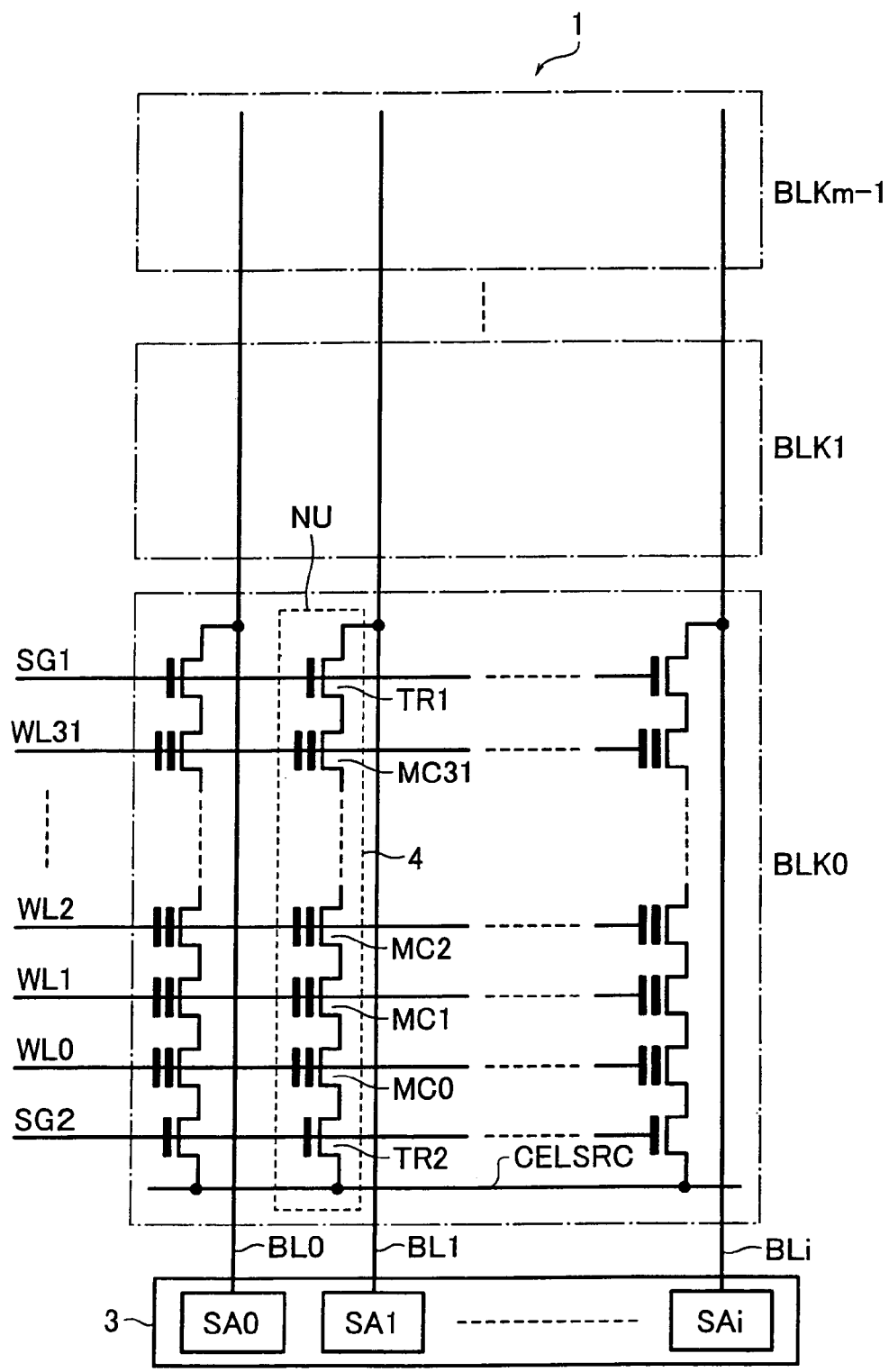
FIG. 2 shows the memory cell array of the flash memory.

FIG. 1 shows a functional block configuration of a NAND-type flash memory device, and FIG. 2 shows an arrangement of a memory cell array 1 thereof. These configuration and arrangement may be used common to the entire embodiments as described below. The memory cell array 1 is formed of NAND cell units NU arranged in a matrix manner. One NAND cell unit NU is formed of plural memory cells MC (MC0, MC1, . . . , MC31) connected in series and select gate transistors TR1 and TR2 coupled to the respective ends of the memory cell string. A drain of the select gate transistor TR1 is coupled to a bit line BL, and a source of the select gate transistor TR2 to a common source line CELSRC.

Control gates of the memory cells MC in one NAND cell unit NU are connected to different word lines WL (WL0, WL1, . . . WL31), respectively. Gates of the select transistors TR1 and TR2 are connected to select gate lines SG1 and SG2, respectively, which are disposed in parallel with the word lines WL. A group of plural memory cells sharing a word line is defined as one page or two pages. A group of plural NAND cell units sharing word lines WL and select gate lines SG1 and SG2 is defined as a block BLK which serves as a unit of data erasure.

As shown in FIG. 2, the memory cell array 1 is divided into plural blocks BLK (BLK0, BLK1, . . . , BLKm-1) in the direction of the bit line BL. The memory cell array 1 including plural blocks is formed on a cell well of a silicon substrate.

Connected to the bit lines BL of the memory cell array 1 is a sense amplifier circuit 3 which has plural sense amplifiers SA constituting a page buffer used for data sensing and for storing write data. The sense amplifier circuit 3 is connected to a data bus 9 via a column select gate circuit 4. A word line drive circuit 2 including a row, decoder is configured to select and drive word lines and select gate lines.

A data input/output buffer 6 transmits data "Data" between the sense amplifier circuit 3 and external I/O controller 7 is programmed to control the entire memory operation on receipt of external control signals such as chip enable signal CEn, write enable signal WEn, read enable signal REn, address latch enable signal ALE, command latch enable signal CLE and the like.

In detail, the controller 7 distinguishes between address "Add." and data "Data" in response to command "Com.", and controls to transfer the address to the word line drive circuit 2 and column gate circuit 4 via an address register 5, and transfer the data to the sense amplifier circuit 3. In addition, the controller 7 executes sequential control of data write and erase, and data read control. A high voltage generating circuit 8 generates various high voltages necessary for the respective operations on receipt of a control signal output from the controller 7.

Figure 21:
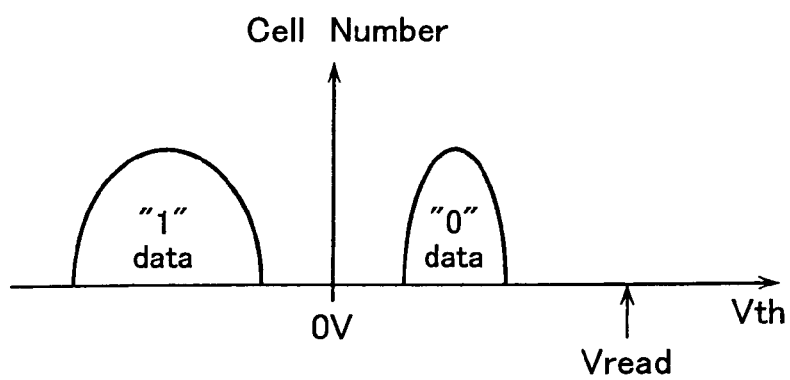
FIG. 21 shows a data threshold distribution in case the flash memory stores binary data.

A relationship between data and threshold voltages in case the memory cell MC stores binary data is the same as shown in FIG. 21 as described above. A negative threshold state of the memory cell is defined as a logic "1" data, and a positive threshold state is defined as a logic "0" data. An operation, which causes a memory cell to be in a "1" data state, is defined as "erase" or "erasure". An operation for causing a memory cell to be in a "0" data state is defined as "write" or "program" in a narrow sense. Data erasure is usually done by a block in the NAND-type flash memory.

Figure 3:
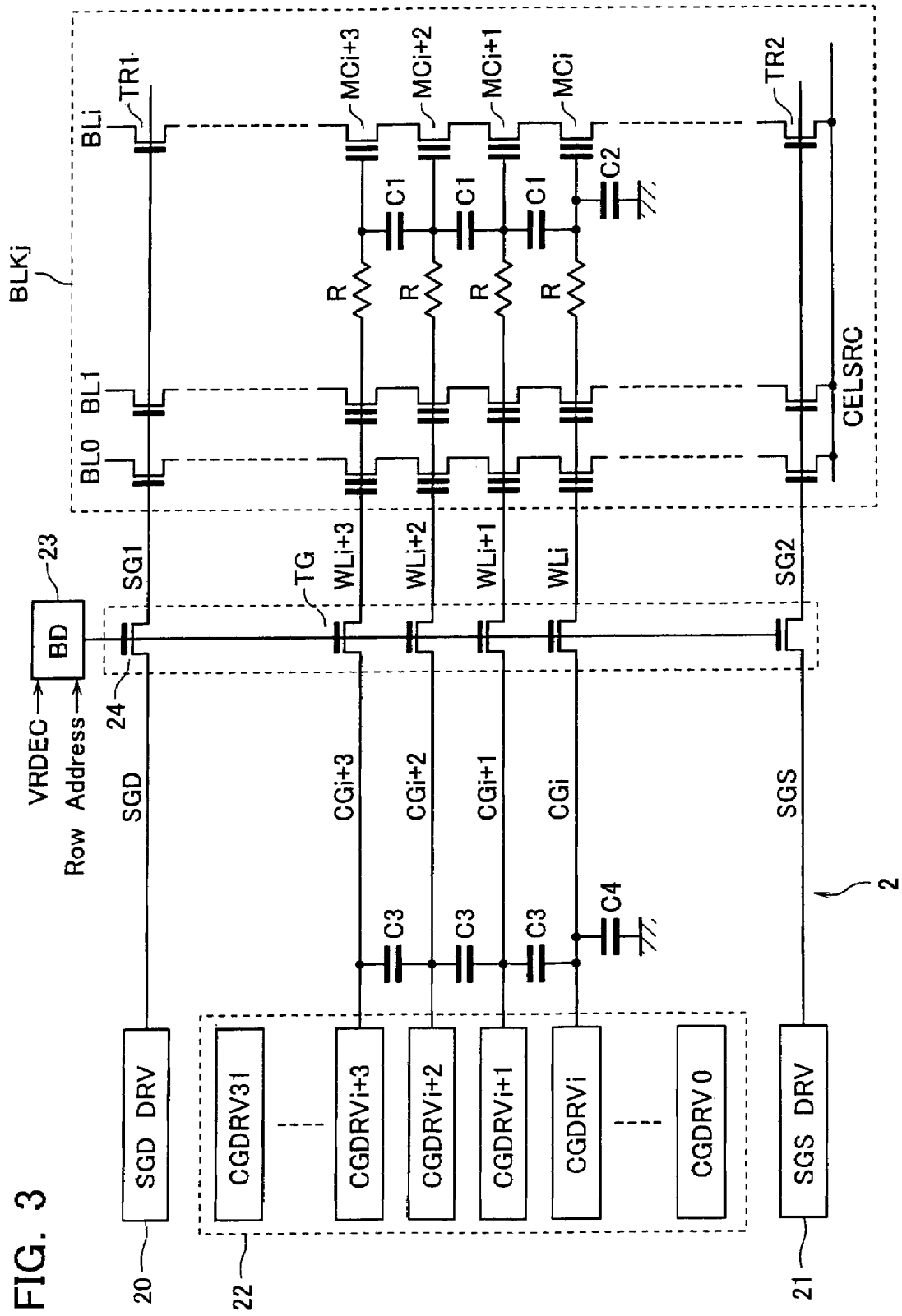
FIG. 3 shows the word line drive circuit of the flash memory.

FIG. 3 shows a main portion circuit of the word line drive circuit 2 with reference to a block BLKj. Word lines WL0–WL31 and select gate lines SG1 and SG2 in the block BLKJ are connected to the corresponding drive signal lines CG0–CG31, SGD and SGS, respectively, via a group of transferring transistors 24. Common gate TG of the transferring transistors 24 is controlled by a block decoder 23. Supplied to the block decoder 23 are row address and high voltage VRDEC output from the high voltage generator 8. The high voltage VRDEC is used for applying a gate voltage which enables the transferring transistors 24 to transfer a high voltage necessary for the word lines in case the block BLKj is selected by the row address.

Disposed at ends of the drive signal lines CG0–CG31, SGD and SGS are word line drivers (CGDRV0–CGDRV31) 22, bit line side select gate line driver (SGDDRV) 20 and source line side select gate line driver (SGSDRV) 21, respectively.

SGD driver 20 is a drive circuit for outputting a drive signal voltage which is required of the gate line (SG1) of the bit line side select transistor TR1 in write, read and erase operations. SGS driver 21 outputs a drive signal voltage required of the gate line (SG2) of the source line side select transistor TR2. CG drivers 22 are drive circuits for outputting drive signal voltages required of the respective word lines WLi.

Although one block BLKj is typically shown in FIG. 3, the SGD driver 20, SGS driver 21 and CG drivers 22 are used common to plural blocks. Therefore, the drive signal lines SGD, SGS, CG0–CG31 are selectively connected to select gate lines and word lines in other blocks (not shown) via other groups of transferring transistors (not shown).

Here, giving attention to word lines WLi, WLi+1, WLi+2 and WLi+3, there are line-to-line capacitance C1 between each adjacent word lines and line-to-ground capacitance C2 between each word line and ground potential. Further, note the drive signal lines CGi, CGi+1, CGi+2 and CGi+3, and there are line-to-line capacitance C3 and line-to-ground capacitance C4. Since the word line has a large resistance, an equivalent resistor R is designated in each word line as shown in FIG. 3.

Figure 4:
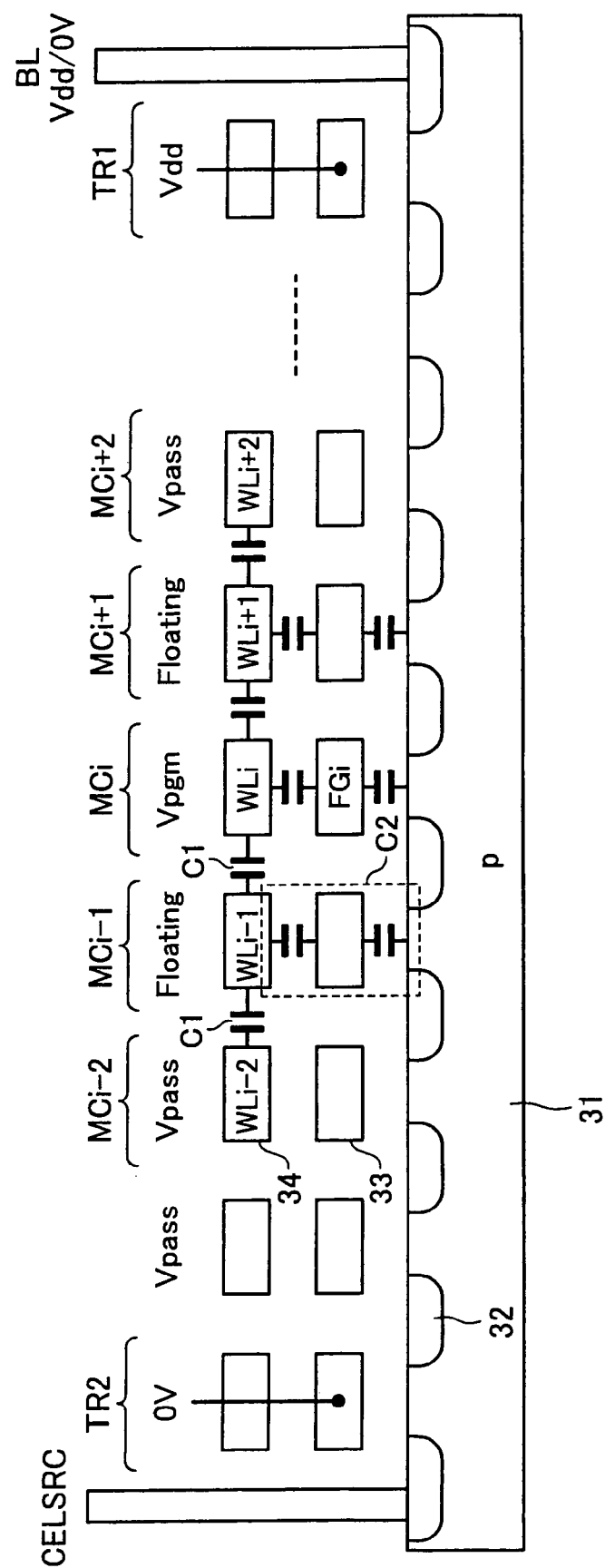
FIG. 4 shows a voltage application state of the flash memory in a data write mode.

FIG. 4 shows a voltage application state in a NAND cell unit at a data write time in comparison with the conventional one shown in FIG. 20. Supposing that word line WLi is selected in this data write mode, two unselected (or non-selected) word lines WLi−1 and WKi+1 disposed adjacent to the selected word line WLi are set in an electrically floating state. The above-described unselected word lines WLi−1, WLi+1 adjacent to the selected word line will be referred to as "adjacent-unselected word lines" hereinafter. At the same time, in the word line drive circuit 2, two unselected (or non-selected) drive signal lines CGi−1, CGi+1 disposed adjacent to the selected drive signal line CGi are set in an electrically floating state. Such the unselected drive signal lines CGi−1, CGi+1 are referred to as "adjacent-unselected drive signal lines". Write pass voltage Vpass is applied to the remaining word lines as similar to the conventional case. The write pass voltage Vpass is selected as to turn on an unselected (non-selected) memory cell without regard to cell data.

In the conventional case that pass voltage Vpass is applied to the entire unselected word lines, capacitance Cw1 of the selected word line is expressed by about the following expression (1).

$$Cw1 = C2 + 2 \times C1 \quad (1)$$

By contrast, when making adjacent-unselected word lines WLi−1 and WLi+1 floating, the selected word line WLi is capacitively coupled to unselected word lines WLi−2, WLi+2 disposed outside of the adjacent-unselected word lines WLi−1, WLi+1. In this case, capacitance Cw1 of the selected word line WLi is expressed as follows:

$$Cw1 = C2 + 2 \times C1(C1 + C2)/(2C1 + C2) \quad (2)$$

Assuming, for example, that the ratio of capacitance C1 to capacitance C2 is C1/C2=0.26/0.48, capacitance Cw1 of the selected word line is: Cw1=0.865 in this embodiment, while Cw1=1 in the conventional case. Therefore, the capacitance of the selected word line is equivalently lessened by 13.5% in accordance with this embodiment. In other words, rising rate of the write voltage Vpgm applied to the selected word line is improved by 13.5%.

For example, assuming that word line resistance is 1M$\Omega$; and word line capacitance is 2.7 pF in the conventional case, CR time constant is 2.7 μsec. By contrast, in this embodiment, CR time constant is improved to be 2.33 μsec as a result of that the word line capacitance is substantially decreased. In practice, the write pulse application time is set as to sure that 100% write voltage is applied to the word line during a certain period. Therefore, in consideration of voltage rising time in which the word line voltage reaches about 100%, it will be expected that the write time is shortened more than the difference of CR time constants as above-described.

Utilizing the word line drive scheme in accordance with this embodiment, it becomes possible to substantially lessen CR delay of the word line without improving the producing process. Therefore, write pulse application time may be shortened as a result of shortening of the word line voltage rising time, and it takes effect that data write may be performed at a high rate.

The reason why the pass voltage Vpass is applied to the entire unselected word lines except a selected word line in the conventional binary data storing scheme is to put no restrictions on the write order concerning the word lines in a block (i.e., in a NAND cell unit). In detail, the pass voltage is selected as to enable the data write into selected memory cells disposed along the selected word line even if there are "0" written cells between a selected word line and the bit line, and as to sufficiently boost the floating channel of "1" write mode. For example, the upper limit of the "0" data threshold distribution shown in FIG. 21 is about 3V, while the pass voltage Vpass is selected to have a value higher than 3V.

In this embodiment, to satisfy a specification as to put no restrictions on the write order in the block, it is necessary for making the floating voltage of the adjacent-unselected word lines higher than the upper limit of "0" data threshold distribution. This floating voltage is determined by: the write voltage Vpgm (including Vpass in case of another control scheme) applied to the floating word lines via capacitance C1, and ground potential Vss applied to them via capacitance C2; and the write voltage Vpgm (including Vpass in case of another control scheme) applied to the floating drive signal lines via capacitance C3, and ground potential Vss applied to them via capacitance C4. Therefore, the floating voltage becomes higher than the upper limit of "0" data threshold in case capacitances C2 and C4 are not extremely great in comparison with capacitances C1 and C3.

What we have to take care of in this embodiment is a fact that there are two kinds of write disturbances in a NAND-type flash memory. One of these disturbances is brought on "1" write memory cells (i.e., write-inhibited cells) connected to a selected word line, and the other on memory cells (i.e., unselected memory cells) connected to unselected word lines. The latter memory cells may be further classified into two groups as follows: (a) memory cells disposed along unselected word lines (to which Vpass is applied) which are not adjacent to the selected word lines; and (b) memory cells disposed along the adjacent-unselected word lines (which are floating). In case the floating voltage of the adjacent-unselected word lines becomes so high as to be in trouble, it is useful to adjust the capacitive coupling between the drive signal lines (CG lines), and/or suitably set an upper limit voltage of the adjacent-unselected word lines in accordance with an embodiment described later.

As described above, the capacitance of the selected word line is substantially lessened by 13.5% by use of the word line drive scheme in accordance with this embodiment, but this is realized on condition that the capacitive coupling between the drive signal lines is approximately equal to that between the word lines. In case line-to-line capacitance ratio, $C3/(2C3+C4)$, in the drive signal line area is larger than that, $C1/(2C1+C2)$, in the word line area, the drive signal lines CGi+1, CGi−1 serve to boost in potential the unselected word lines WLi+1, WLi−1 to a certain degree, thereby causing the CR time constant of the word line to be further lessened.

Figure 5:
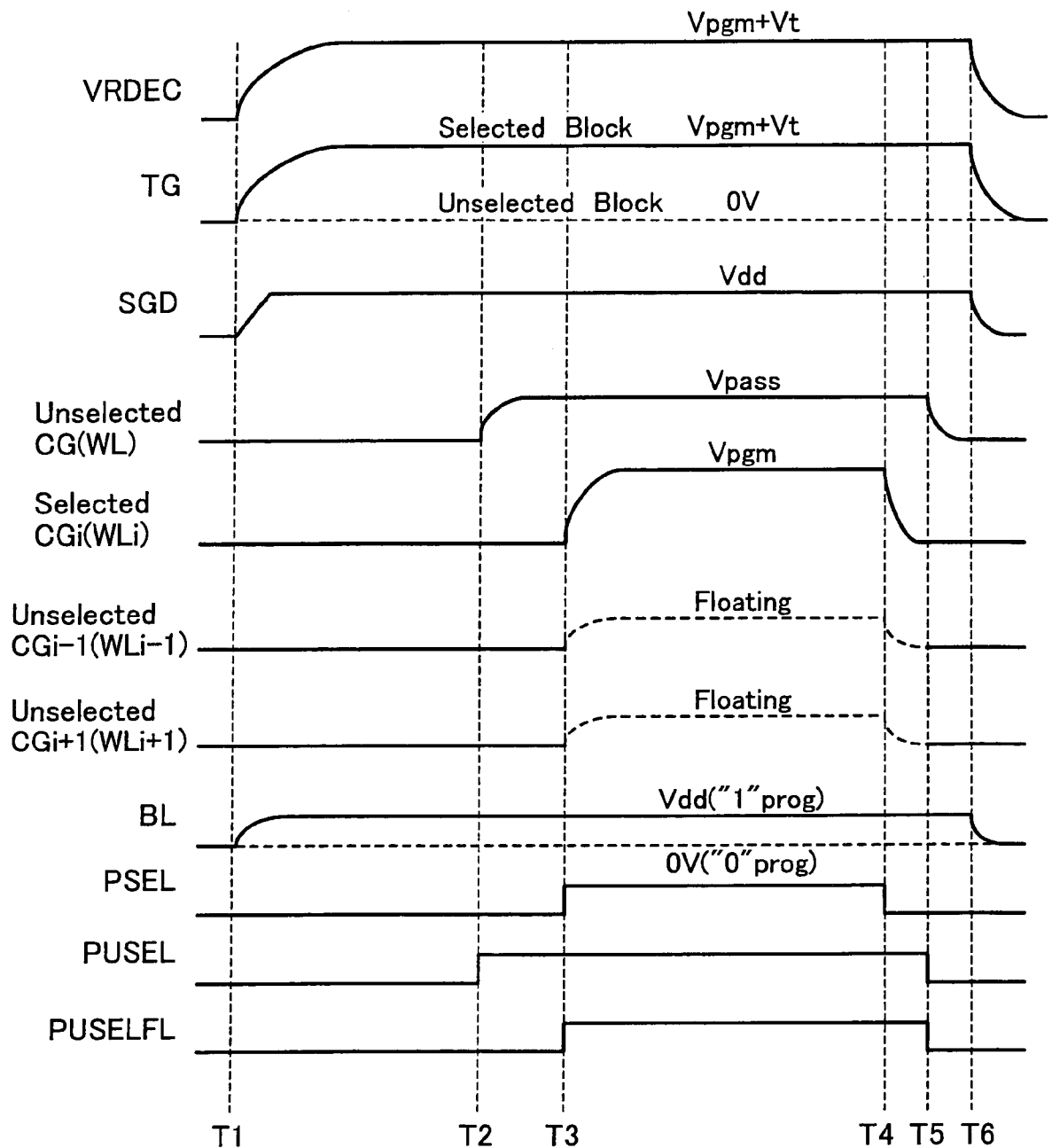
FIG. 5 shows a write timing chart of the flash memory.

FIG. 5 shows a write timing chart for achieving the voltage applying state shown in FIG. 4. PSEL, PUSEL and PUSELFL are control signals output from the controller 7 in a data write mode. At timing T1, raise the high voltage output VRDEC to Vpgm+Vt (Vt: threshold voltage of the transferring transistors) that enables the transferring transistors 24 to transfer the write voltage Vpgm to a selected word line without voltage drop. In a selected block, common gate TG of the transferring transistors 25 rises with substantially the same voltage waveform as VRDEC. At the same timing T1, write data are transferred to bit lines BL from the sense amplifier circuit 3.

Control signal PUSEL becoming "H" at timing T2, a write pass voltage Vpass is generated from CG drivers for unselected word lines which are not adjacent to a selected word line WLi. That is, the write pass voltage Vpass rises up in advance of the write voltage Vpgm. As control signal PUSELFL becomes "H" at timing T3, the output nodes of CG drivers CGDRVi−1 and CGDRVi+1 become floating, whereby adjacent-unselected word lines WLi−1 and WLi+1 are set in a floating state. Control signal PSEL becoming "H" at the same timing T3, CG driver CGDRVi outputs the write voltage Vpgm to be transferred to the selected word line WLi.

The voltage application relationship from timing T3 to timing T4 is that shown in FIG. 4. A period from timing T4 to timing T6 is a recovery operation period. At timing T4, the write voltage Vpgm applied to the selected word line WLi is discharged. In response to this, the adjacent-unselected word line WLi−1, WLi+1 and the corresponding drive signal lines CGi−1, CGi+1 are pulled down in potential. At timing T5, unselected word lines are discharged. Following it, discharging the bit line at timing T6, the write pulse application operation ends.

Figure 6:
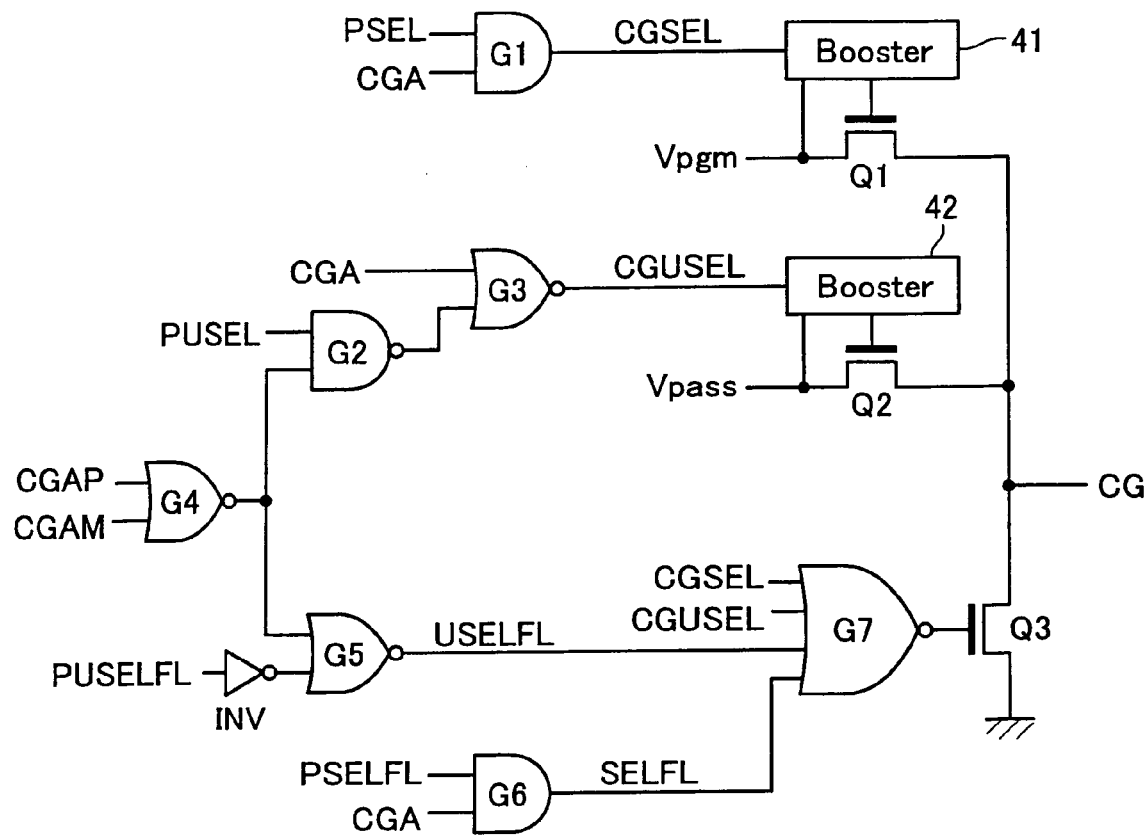
FIG. 6 shows a word line driver configuration in the word line drive circuit shown in FIG. 3.
Figure 7:
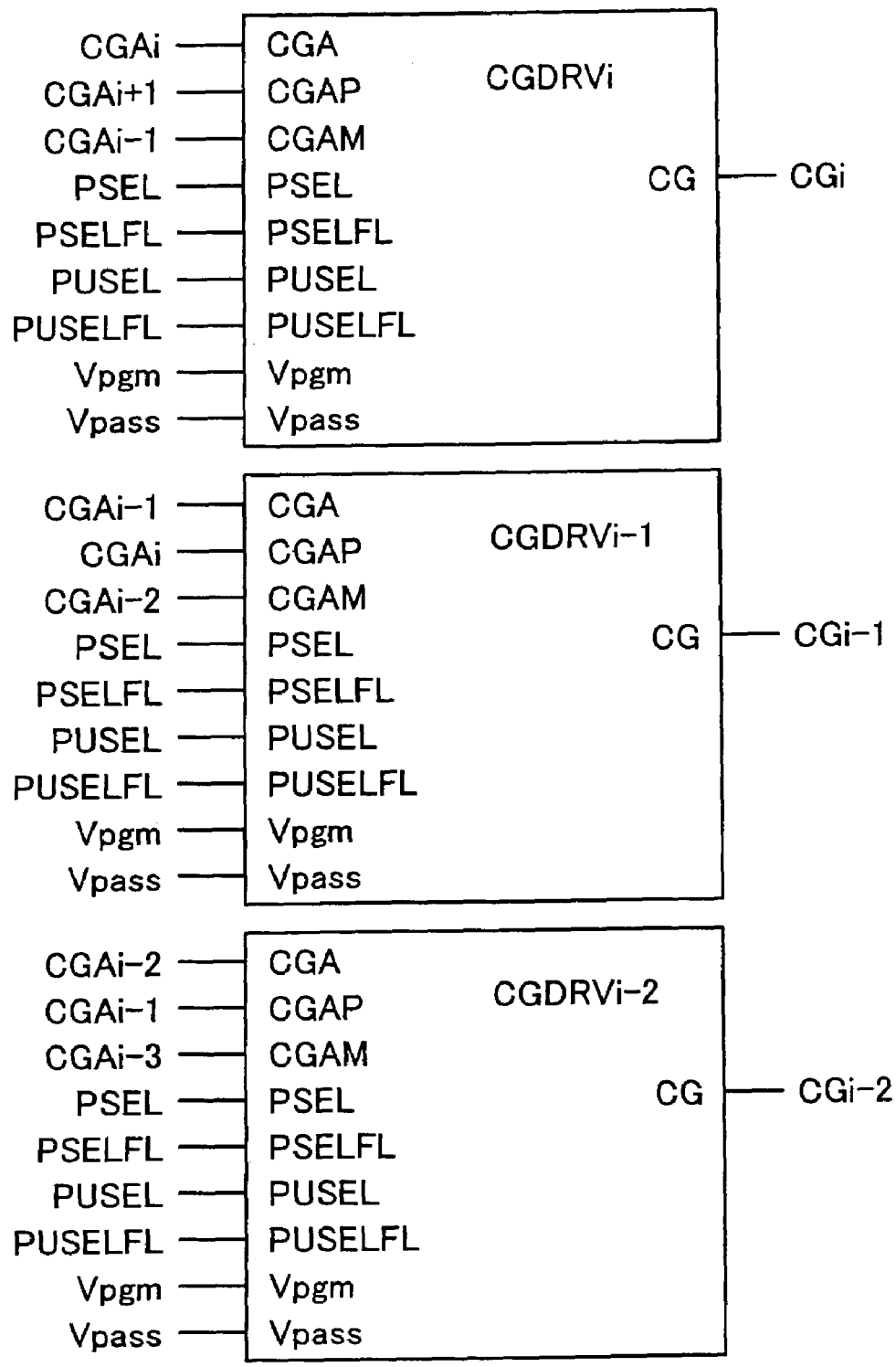
FIG. 7 shows input connection relationships of adjacent three word line drivers.

FIG. 6 shows a detailed configuration of a word line driver CGDRG, which is possible to drive a word line as above-described, with respect to circuit portions necessary for the write operation. FIG. 7 shows input connection relationships for adjacent three word line drivers CGDRVi, CGDRVi−1 and CGDRVi−2. Input node CGA of the driver CGDRV is one, to which an output of a page decoder, which selects one in thirty two word lines, is input. In the word line driver CGDRB, further two input nodes CGAP and CGAM are prepared in addition to the input node CGA.

AND gate G1 is disposed to output an enable signal CGSEL="H" when decoded output "H" is input to the input node CGA, and control signal PSEL="H" is input at the same time. In response to this enable signal CGSEL, a booster 41 becomes active to turn on a transistor Q1, whereby write voltage Vpgm is output to an output node CG.

NOR gate G7 is a logic circuit for selectively turning off a transistor Q3, which is coupling the output node CG to the ground potential in a stationary state. Signals input to this NOR gate G7 are: enable signal CGSEL serving for outputting the above-described write voltage Vpgm; enable signal CGUSEL serving for outputting the pass voltage Vpass as described later; and other signals controlled by control signal PUSELFL serving for setting adjacent-unselected word lines to be floating and the like. Therefore, when outputting the write voltage Vpgm in response to the enable signal CGSEL="H", the NOR gate G7 outputs "L" so as to turn off the transistor Q3.

The remaining two input nodes CGAP and CGAM become those of NOR gate G4. To these input nodes CGAP, CGAM, two page decoder output signals adjacent to a page decoder output signal which is supplied to the input node CGA. In detail, as shown in FIG. 7, decoded outputs CGAi+1 and CGAi−1 are supplied to the input nodes CGAP and CGAM, respectively, in the driver CGDRVi in which decoded output CGAi is supplied to the input node CGA. Decoded outputs CGAi and CGAi−2 are supplied to the input nodes CGAP and CGAM, respectively, in the driver CGDRVi−1 in which decoded output CGAi−1 is supplied to the input node CGA. In a similar way, a page decoder output concerned and two page decoder outputs adjacent to it are input to each of the remaining drivers.

The NOR gate G4 serves as a logic circuit for distinguishing the adjacent-unselected word lines from other unselected word lines and controlling them. For example, in FIG. 7, when the driver CGDRVi−1 outputs the write voltage Vpgm, either one of input nodes CGAP and CGAM becomes "H" in the drivers CGDRVi and CGDRVi−2, thereby disabling NAND gate G2 and activating NOR gate G5. Therefore, as the control signal PUSELFL becomes "H", NOR gate G5 outputs an enable signal USELFL="H". In response to this, the output of NOR gate G7 becomes "L" to turn off the transistor Q3. As a result, the output node CG becomes floating. On the other hand in this case, NAND gate G2 is in a disabled state, and enable signal CGUSEL is "L" without regard to the control signal PUSEL. Therefore, pass voltage Vpass is not transferred to the output node CG.

In other drivers CGDRV corresponding to the remaining word lines which are not adjacent to the selected word line, both of two inputs of NOR gate G4 become "L", thereby activating NAND gate G2. Therefore, when control signal PUSEL becomes "H", the output of NAND gate G2 becomes "L". At this time, input node CGA is "L" for each unselected word line, and enable signal CGUSEL output from the NOR gate G3 becomes "H". In response to this, transistor Q3 is turned off, and booster 42 is activated, whereby write pass voltage Vpass is transferred to the output node CG via transistor Q2 driven by the booster 42.

[Embodiment 2]

Figure 8:
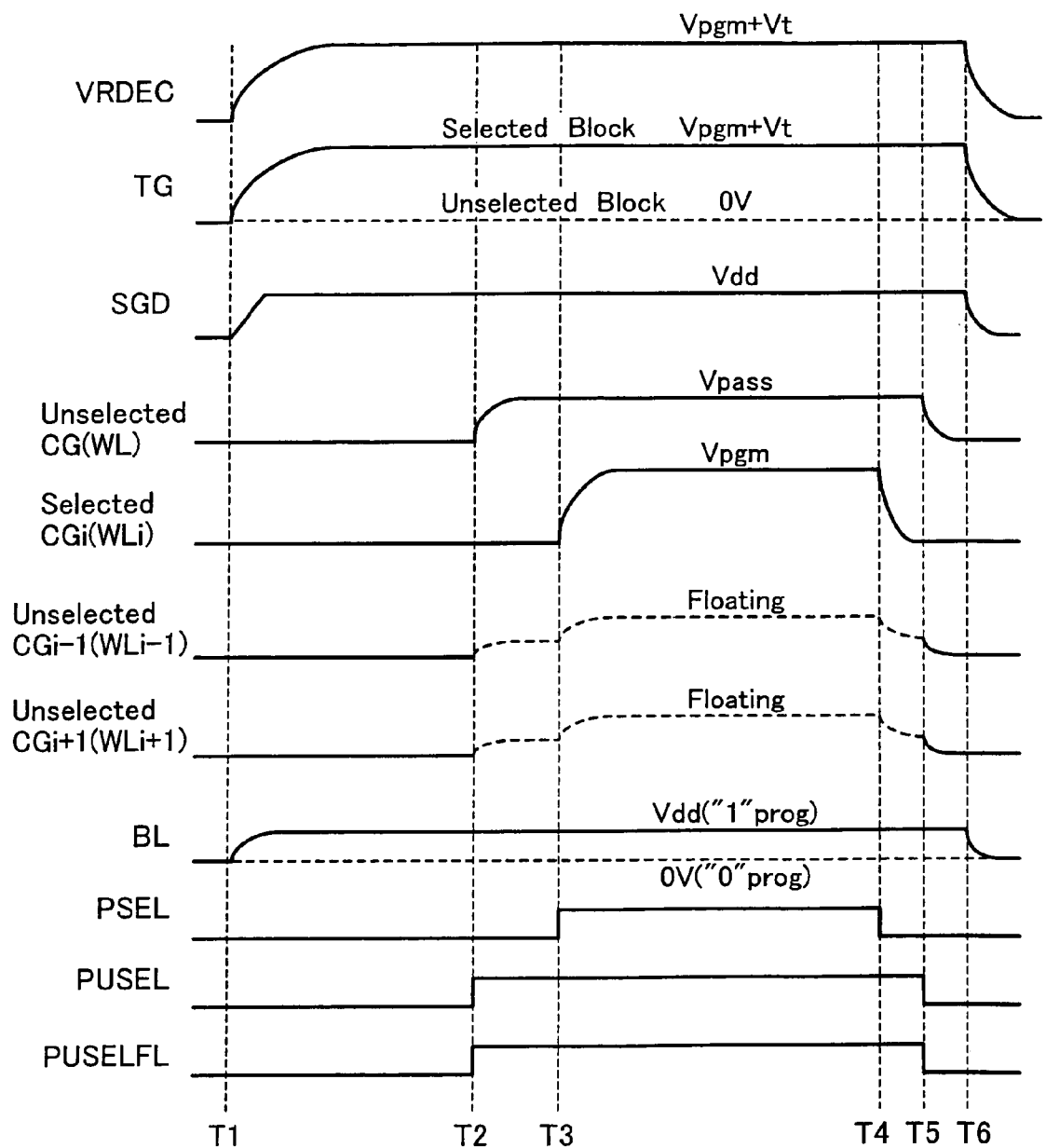
FIG. 8 shows another write timing chart with a word line drive scheme different from that shown in FIG. 5.

FIG. 8 shows a timing chart in accordance with another write operation example different from that shown in FIG. 5. In case of FIG. 5, the adjacent-unselected word lines WLi−1, WLi+1 are boosted in potential only by capacitive coupling from the selected word line WLi. As shown in FIG. 8, in order to boost the adjacent-unselected word lines WLi−1, WLi+1 to be higher than that in the embodiment shown in FIG. 5, it is effective to raise the control signal PUSELFL to be "H" at timing T2 so as to make the adjacent-unselected word lines WLi−1, WLi+1 floating before rising of the write voltage Vpgm.

For example, giving attention to the adjacent-unselected word line WLi−1 (CGi−1) in case word line WLi (CGi) is selected, it starts to rise up in potential at timing T2 by capacitive coupling from word line WLi−2 (CGi−2) adjacent to WLi−1 (CGi−1), which rises up to Vpass at timing T2. Further, the selected word line WLi (CGi) starts to rise up at timing T3, whereby additional capacitive coupling is added to the unselected word line WLi−1. As described above, setting the timing, when the adjacent-unselected word lines WLi−1, WLi+1 are made floating, to be in advance of the rising of the write voltage Vpgm applied to the selected word line WLi, it is possible to make the floating voltage of the adjacent-unselected word lines higher than that in case of FIG. 5.

[Embodiment 3]

Figure 9:
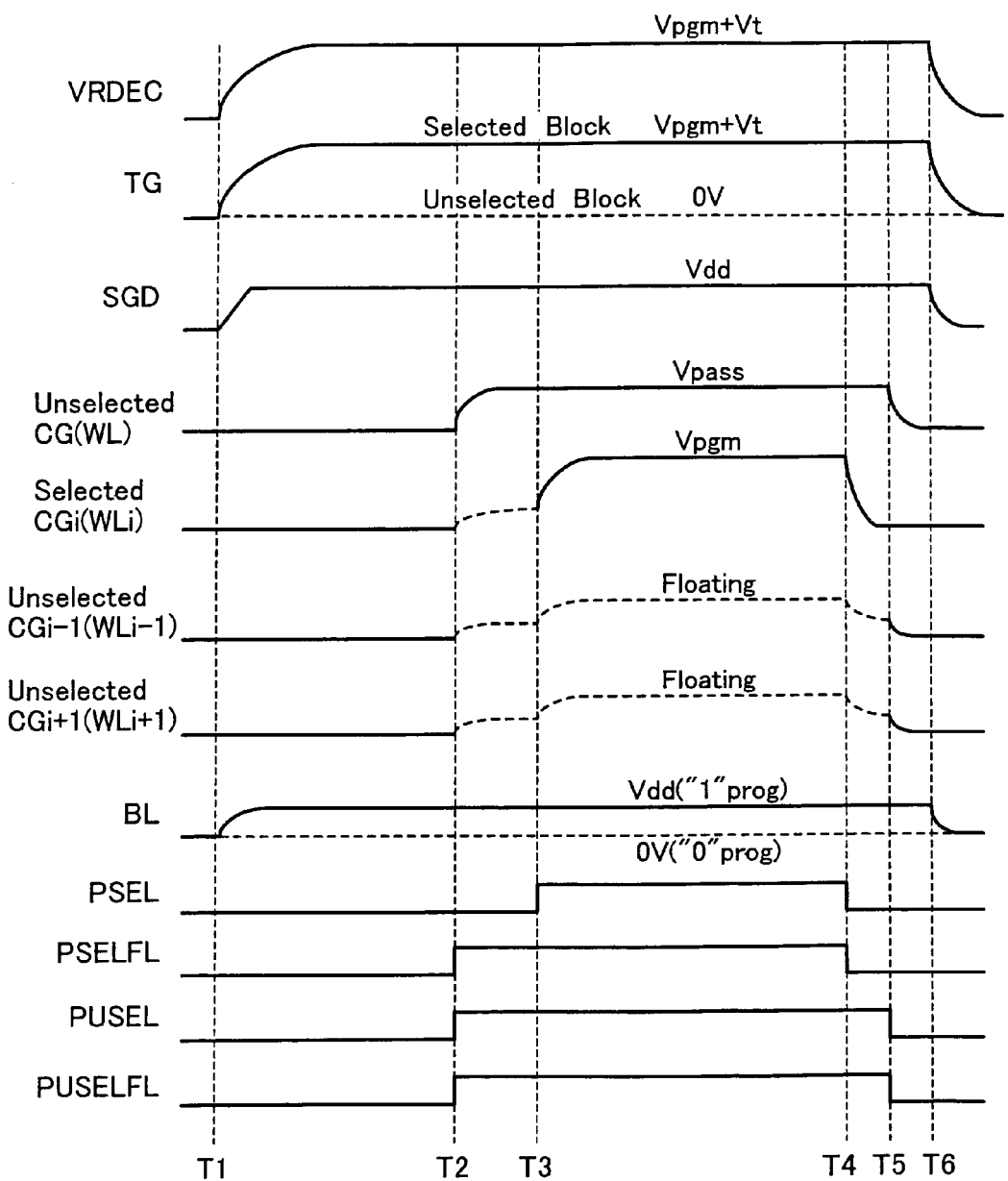
FIG. 9 shows still another write timing chart with a word line drive scheme different from that shown in FIG. 5.

FIG. 9 shows a timing chart in accordance with still another write operation example different from that shown in FIG. 5. It is different from the above-described Embodiment 2 shown in FIG. 8 that the selected word line WLi is also set in a floating state during timings T2–T3 (i.e., from rising of the write pass voltage Vpass to rising of the write voltage Vpgm). This control may be possible by use of AND gate G6 in the word line driver CGDRV shown in FIG. 6. Two inputs of AND gate G6 are page decoder output (CGA) for boosting the selected word line to write voltage Vpgm, and control signal PSELFL, which is used for setting the selected word line in a floating state.

Making the control signal PSELFL "H" at timing T2, transistor Q3 becomes off prior to outputting the write voltage Vpgm at timing T3. Therefore, the selected word line WLi is set in a floating state from timing T2 to timing T3.

This Embodiment 3 is effective for improving the electrical properties of the transferring transistors 24. The reason is as follows. A high voltage, Vpgm+Vt, is applied to the common gate TG of the transferring transistors 24 during T2-T3. If there is a situation that 0V is applied to a source/drain in transistors disposed adjacent to each other, it causes field inversion leakage. According to this Embodiment 3, voltages higher than 0V are applied to the entire source/drains of the transferring transistors 24. Therefore, field inversion leakage in the group of transferring transistors 24 may be suppressed.

Further, in this Embodiment 3, the selected word line WLi is a little boosted in potential due to capacitive coupling from unselected word lines during T2–T3. Therefore, it is possible to lessen the amount of charging in the selected word line after applying the write voltage Vpgm.

[Embodiment 4]

Figure 10:
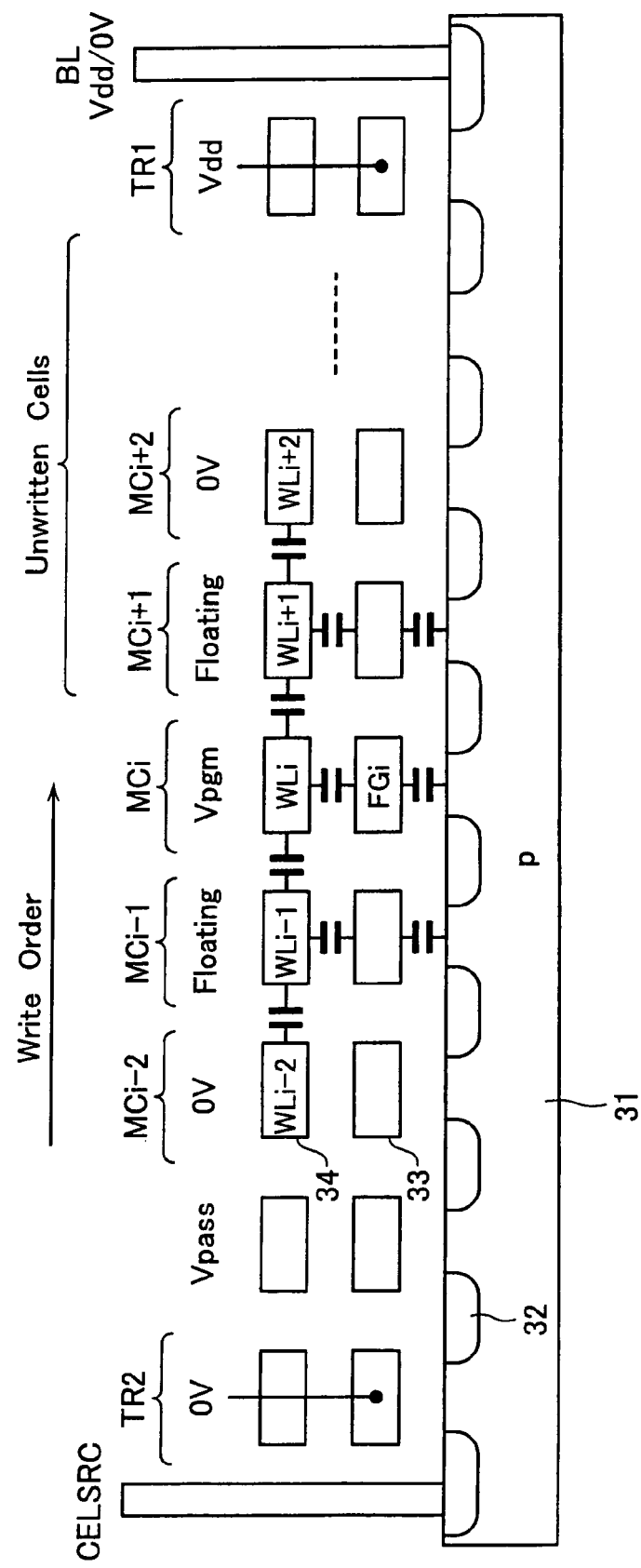
FIG. 10 shows another voltage application state with a word liner drive scheme different from that shown in FIG. 4.

FIG. 10 shows another voltage application state of a NAND cell unit during a write operation in contrast to that shown in FIG. 4. It is the same as above-described embodiments that the adjacent-unselected word lines WLi−1, WLi+1 are set in a floating state. In contrast to FIG. 4, 0V is applied to unselected word lines WLi−2 and WLi+2, which are disposed adjacent to the adjacent-unselected word lines WLi−1 and WLi+1, respectively, in this Embodiment 4.

To achieve such word line driving, it is required of the memory cell disposed between the selected word line WLi and bit line BL and driven by the unselected word line WLi+2, to which 0V is applied, to be in an erased state with a negative threshold voltage (i.e., "0" data has not written).

Due to this, it is necessary for putting restrictions on the data write order. In detail, it is required to perform data write in accordance with such a write order that word lines are selected in order from one close to the cell source line CELSRC, as shown in FIG. 10.

The above-described word line drive scheme seems as a modified example of a conventional "Local Self Boost (LSB)" scheme. The LSB scheme is known as an effective channel boost scheme for boosting a channel of "1" write cell (i.e., write inhibited cell) in the memory cells arranged along a selected word line by separating the channel from others. However, in the conventional LSB scheme, there is a fear of reducing device reliability due to that a large electric field is applied to a peripheral portion of the to-be-boosted cell channel.

Since 0V is applied to two unselected word line disposed adjacent to the adjacent-unselected word lines in the scheme shown in FIG. 10, the channel region to be self-boosted is extended across three cells so as to become larger than that in the conventional LSB scheme, the electric field concentration may be suppressed.

[Embodiment 5]

Figure 11:
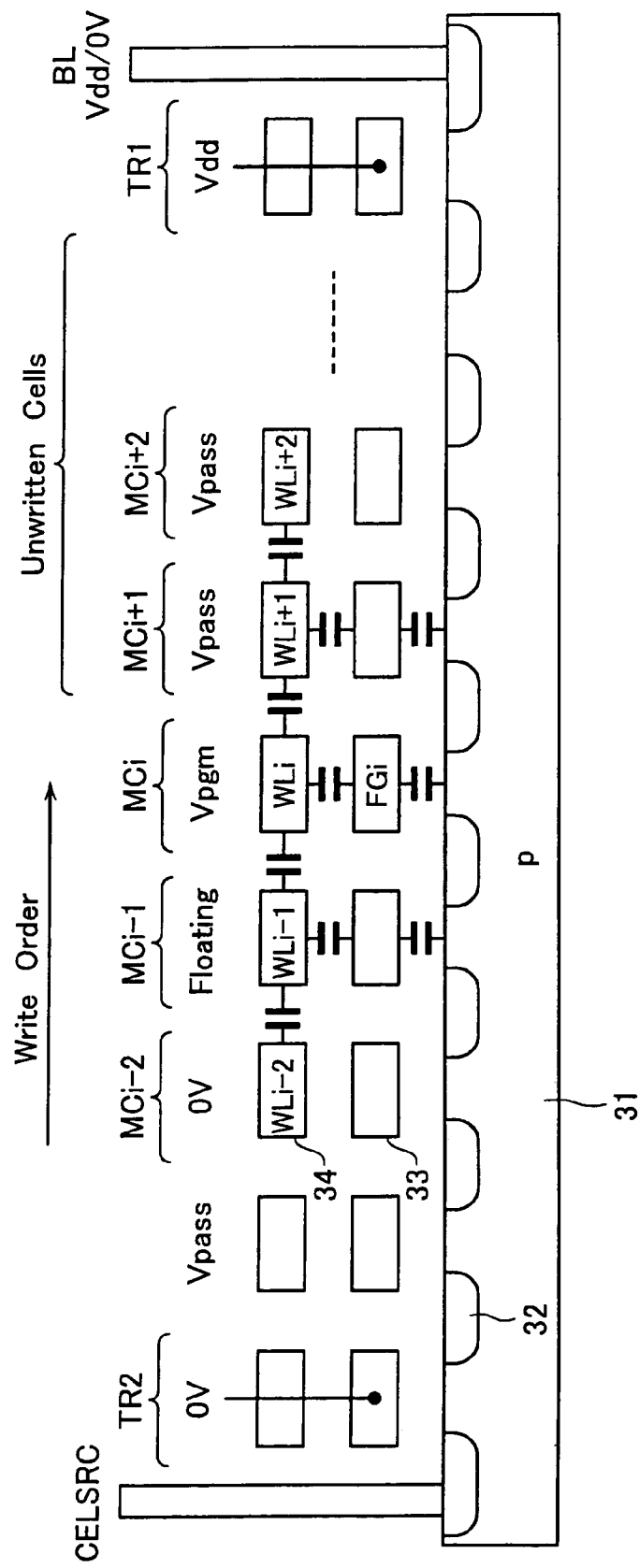
FIG. 11 shows still another voltage application state with a word liner drive scheme different from that shown in FIG. 4.

FIG. 11 shows a voltage application state of a NAND cell unit during a write operation in accordance with still another Embodiment 5. In this Embodiment 5, only one word line, WLi−1, disposed at the source line CELSRC side, in two adjacent-unselected word lines WLi−1 and WLi+1, is set in a floating state, and pass voltage Vpass is applied to the other, WLi+1, disposed at bit line BL side. To the remaining word lines, pass voltage Vpass is applied.

Utilizing such a scheme as to make one of the adjacent-unselected word lines floating, the effect of reducing CR delay of the selected word line is reduced in comparison with the above-described embodiments. However, the word line drive scheme according to this Embodiment 5 is effective for the following reason.

Since the word line drive scheme in accordance with this invention is strongly dependent on the wiring layout, it is not easy to surely control the floating word line to a targeted voltage. This becomes a problem specifically in such a case that one memory cell stores 4-value data. In detail, within 4-value data write schemes, there is a case that 2-value data part is previously written into memory cells disposed along a word line which is disposed at the bit line side of a selected word line. In other words, there is a case that memory cell MCi is written after having written into memory cell MCi+1. In this case, to surely write data into the memory cell MCi by driving the selected word line WLi, it is required of the adjacent-unselected word line WLi+1 to be surely applied with a voltage higher than the threshold voltage of memory cell MCi+1 which has already been written.

If it is not sure to set the floating word line WLi+1 to have a predetermined voltage, it is preferable to apply the write pass voltage Vpass to the adjacent-unselected word line WLi+1 disposed at bit line BL side as similar to the conventional case.

[Embodiment 6]

Figure 12:
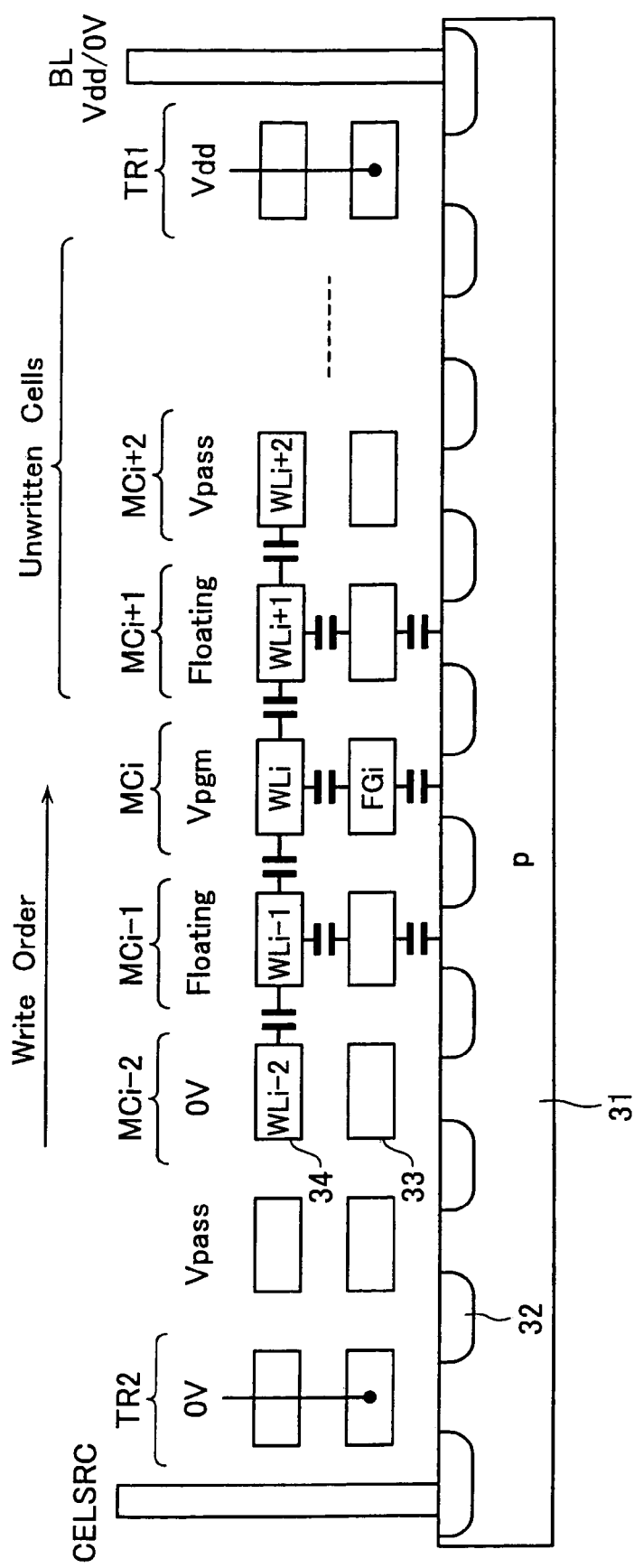
FIG. 12 shows still another voltage application state with a word liner drive scheme different from that shown in FIG. 4.

FIG. 12 shows still another voltage application state of a NAND cell unit during a write operation in accordance with still another Embodiment 6. In case of FIG. 11, one word line, WLi+1, within two adjacent-unselected word lines WLi−1, WLi+1 is set in a floating state. In contrast to this, both of the adjacent-unselected word lines are set in a floating state in this embodiment 6. The Others are the same as those shown in FIG. 11.

In case there are no restrictions defined by the threshold voltages of unselected cells disposed at the bit line side of the selected word line, or a necessary voltage is obtained on a floating word line, it is permitted to make two adjacent-unselected word lines floating.

[Embodiment 7]

Figure 13:
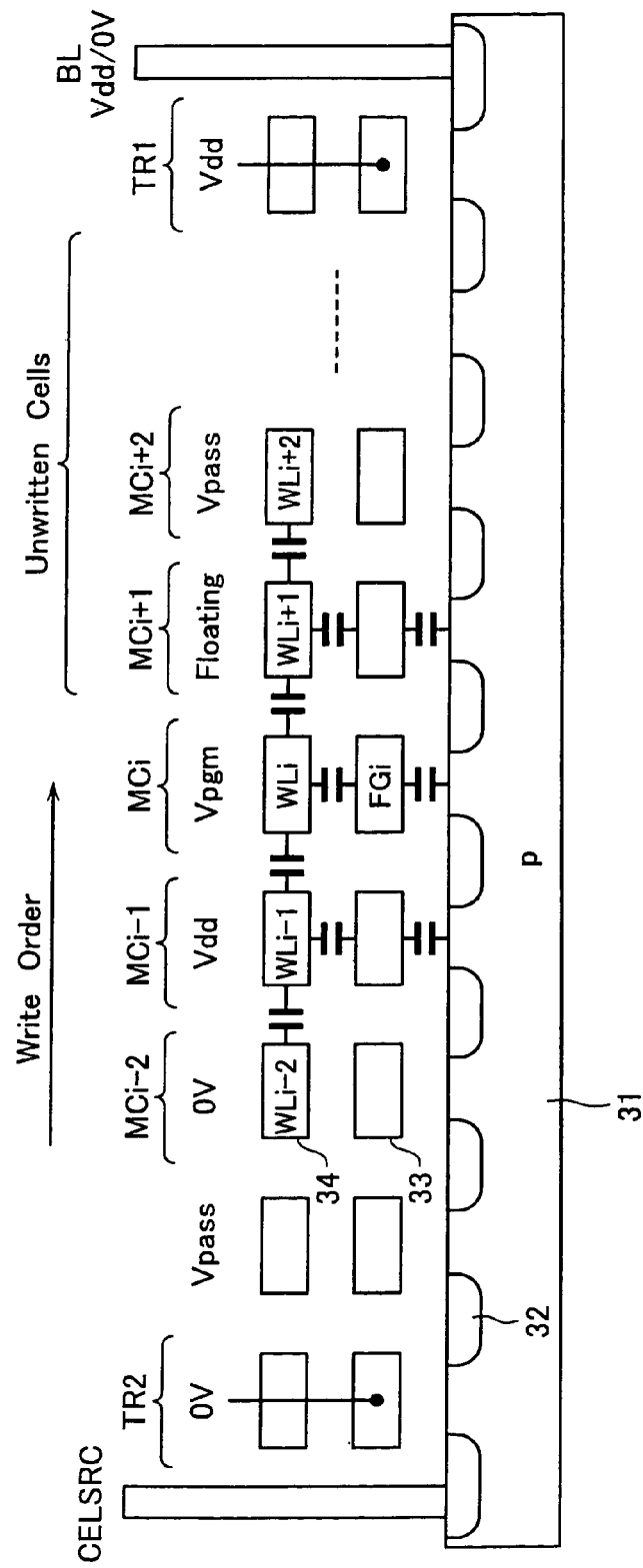
FIG. 13 shows still another voltage application state with a word liner drive scheme different from that shown in FIG. 4.

FIG. 13 shows still another voltage application state of a NAND cell unit during a write operation in accordance with still another Embodiment 7. In contrast to the Embodiment 5 shown in FIG. 11, a fixed voltage (e.g., power supply voltage Vdd) is applied to one word line, WLi−1, disposed at the source line CELSRC side, in two adjacent-unselected word lines WLi−1 and WLi+1, and the other, WLi+1, disposed at bit line BL side is set in a floating state. The others are the same as in FIG. 11.

In case it is required to precisely set the voltage of the adjacent-unselected word line WLi−1 disposed at the cell source line CELSRC side of the selected word line, it is useful to apply a fixed voltage to it, while setting only the adjacent-unselected word line WLi+1 disposed at the bit line BL side.

[Embodiment 8]

Figure 14:
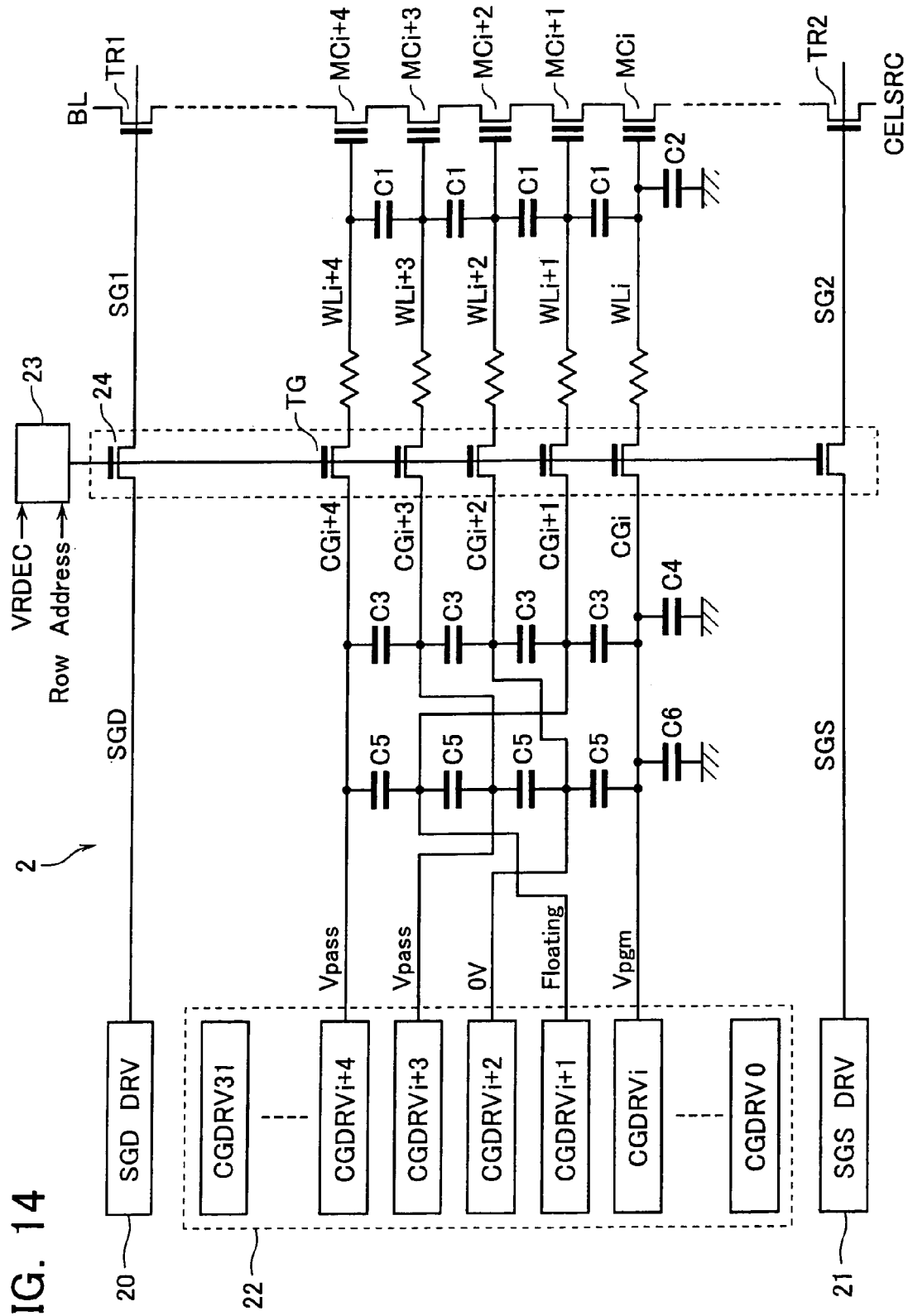
FIG. 14 shows another configuration example of the word line drive circuit.

FIG. 14 shows a modified example of the word line drive circuit 2. Different from that shown in FIG. 3 is that the drive signal lines (CG lines) disposed between the word line drivers 22 and the transferring transistors 24 are formed to cross each other at least in part. By use of such a drive signal line layout, it becomes possible to adjust the line-to-line capacitance between the drive signal lines, and adjust the voltage coupled to a floating drive signal line. Therefore, it becomes possible to adjust the voltage of the floating adjacent-unselected word lines to be at a desirable value in a data write mode.

[Embodiment 9]

Figure 15:
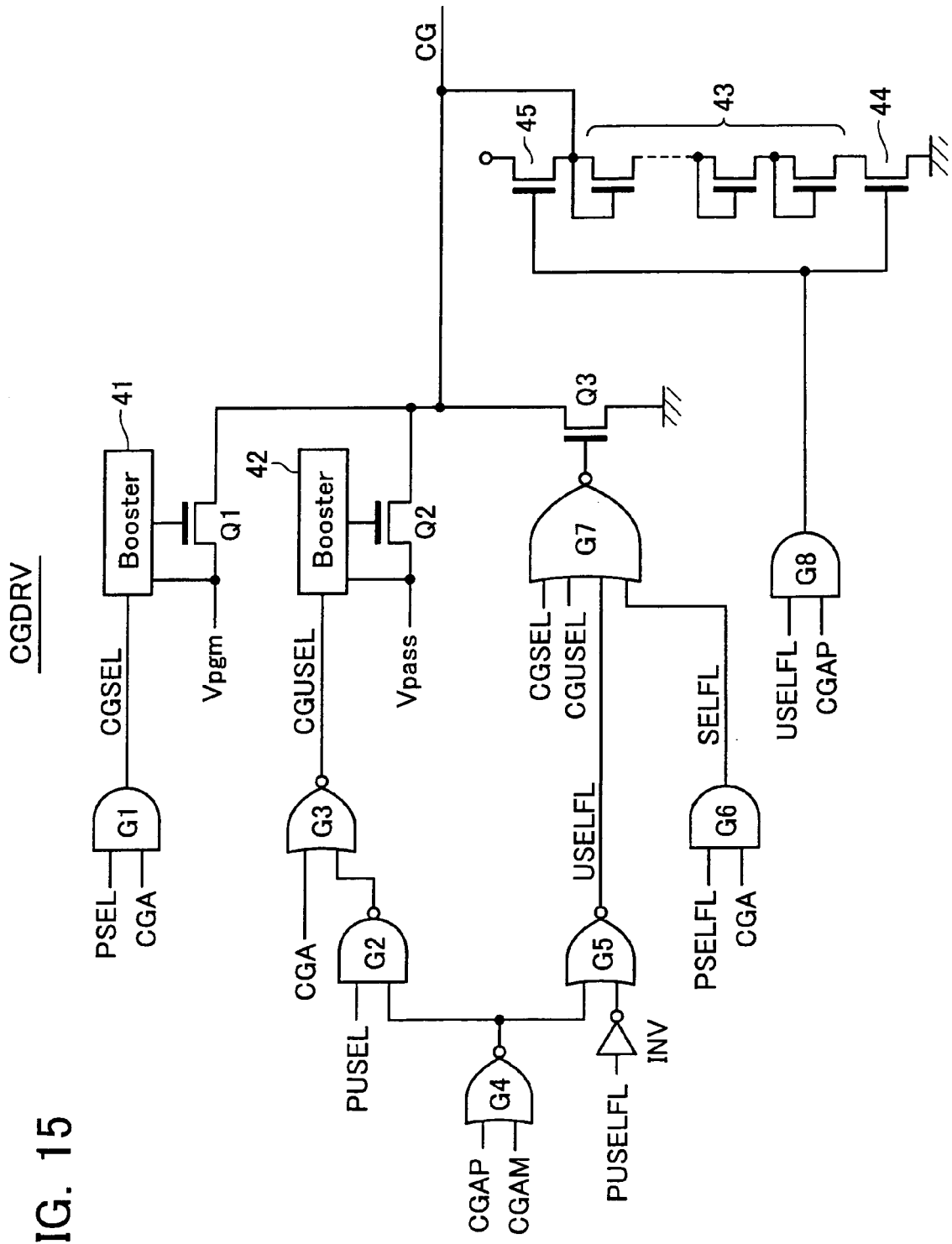
FIG. 15 shows another configuration of the word line driver.

FIG. 15 shows a modified example of the word line driver CGDRV. Different from that shown in FIG. 6 is that a voltage limiter 43 is connected to the output node CG so as to be activated when the output node is set in an electrically floating state. The voltage limiter 43 is formed of a plurality of diode-connected NMOS transistors connected in series. An activating NMOS transistor 44, gate of which is controlled by AND gate G8, is disposed between the voltage limiter 43 and the ground potential.

Enable signal USELFL output from NOR gate G5 for setting the unselected word lines to be floating, and page decoder output CGAP are input to AND gate G8. When making the adjacent-unselected word line disposed at the source line side of the selected word line floating, transistor 44 becomes on, thereby activating the voltage limiter 43 in the word line driver corresponding to the adjacent-unselected word line. As a result, the voltage of the floating word line is limited to be equal to or lower than a certain level.

Further disposed between the voltage limiter 43 and the output node CG is a pull-up NMOS transistor 45, gate of which is controlled by AND gate G8. This NMOS transistor 45 becomes on when the voltage limiter 43 is activated. Therefore, the voltage of the output node CG becoming lower than Vdd−Vt (Vt:threshold voltage of NMOS transistor 45), NMOS transistor 45 serves to supply current, thereby suppressing the voltage drop of the output node CG. In other words, the pull-up NMOS transistor 45 prevents the unselected word line, which is connected to the output node CG and set in a floating state, from voltage-swinging in the negative direction due to capacitive coupling from the selected word line when it is discharged.

Although one page decoder output CGAP is input to AND gate G8 in case of FIG. 8, OR logic signal of two page decoder outputs CGAP and CGAM may be input to it. Due to this alternative, it becomes possible to activate the voltage limiter 43 for two adjacent-unselected word lines.

[Embodiment 10]

In another word line drive scheme in accordance with Embodiment 10 (not shown), at the data write time when the write voltage is applied to a selected word line, four adjacent-unselected word lines, which are disposed at both side of the selected word line by haves, are set in a floating state, while a write pass voltage is applied to the remaining unselected word lines. By use of such the word line drive scheme, it becomes possible to further lessen the CR delay of the selected word line.

[Embodiment 11]

The above-described operation defined as to set adjacent-unselected word lines in a floating state is effective not only in the data write mode, but also in a certain kind of data read mode. Referring to FIGS. 16–19, Embodiment 11 with such the data read operation will be explained bellow.

Figure 17:
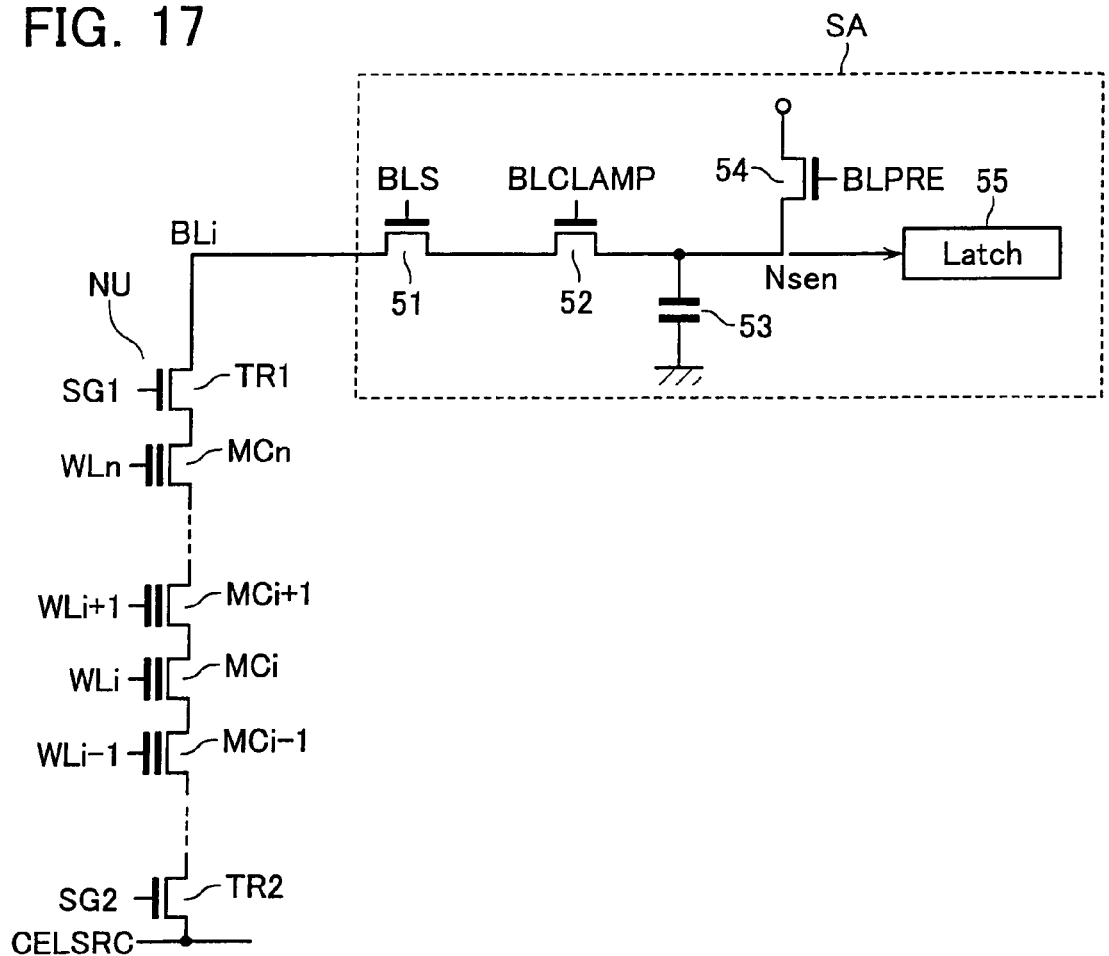
FIG. 17 shows a main portion of a sense amplifier concerned to the data read operation.

FIG. 17 shows a main circuit portion of a sense amplifier SA in the sense amplifier circuit 3 concerned to data read together with a NAND cell unit NU to be connected to it. The sense amplifier SA has a sense node, Nsen, to be selectively coupled to a bit line BLi. That is, the sense node Nsen is coupled to the bit line BLi via clamping NMOS transistor 52 and bit line selecting NMOS transistor 51. Further, precharging NMOS transistor 54 for precharging the sense node Nsen and bit line BLi, and charge holding capacitor 53 are connected to the sense node Nsen. Further connected to the sense node Nsen is a data latch 55 for storing read out data.

Figure 18:
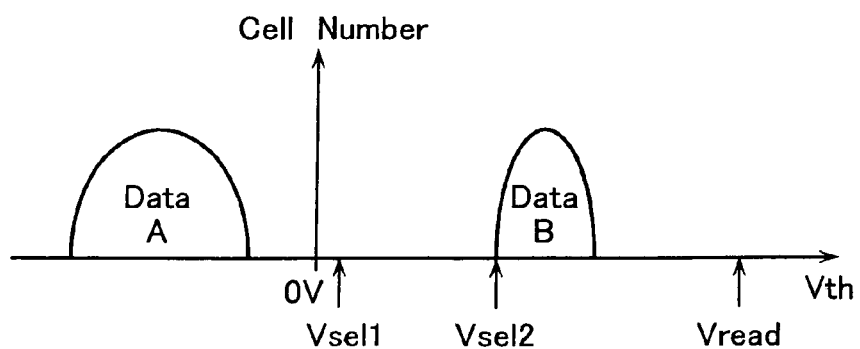
FIG. 18 shows a data threshold distribution for explanation of the data read operation.
Figure 19:
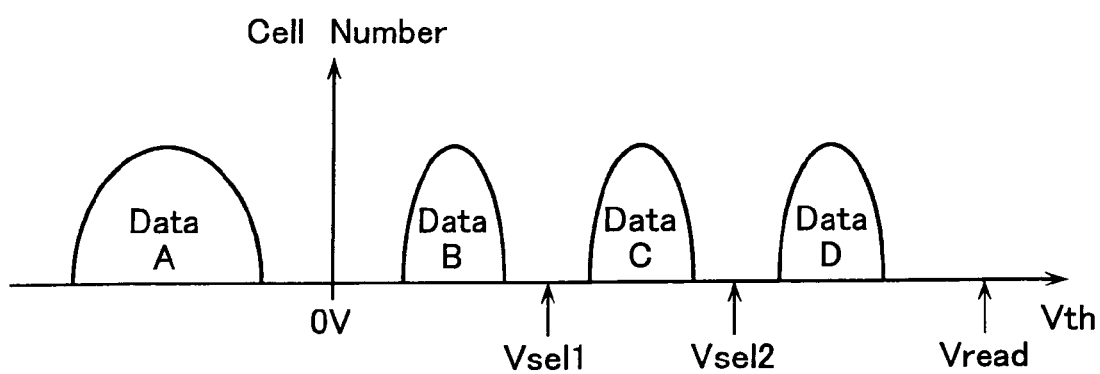
FIG. 19 shows another data threshold distribution for explanation of the data read operation.

In a data read mode in accordance with this embodiment, first and second data sensing operations with different data judging conditions from each other are executed in first and second periods, respectively, while bit line voltage changes in response to a selected cell's data, after having precharged the bit line. In detail, what cases are supposed here are, for example, as follows. One case is that 2-value data, "DataA" and "DataB", the threshold distribution of which is shown in FIG. 18, is read out with first and. second steps in which read voltages applied to a selected word line are set as Vse11 and Vse12, respectively. In this case, Vse11 is selected as being sufficiently lower than the threshold voltage of DataB and higher than the threshold voltage of DataA, and Vse12 is selected as being equal to about the lower limit threshold voltage of DataB. Another case is that 4-value data, "DataA", "DataB", "DataC" and "DataD", the threshold distributions of which are shown in FIG. 19, is read out with first and second steps in which read voltages applied to a selected word line are set as Vse11 and Vse12, respectively. In this case, Vse11 is set as to distinguish DataA from DataB, and Vse12 is set as to distinguish DataC from DataD.

Figure 16:
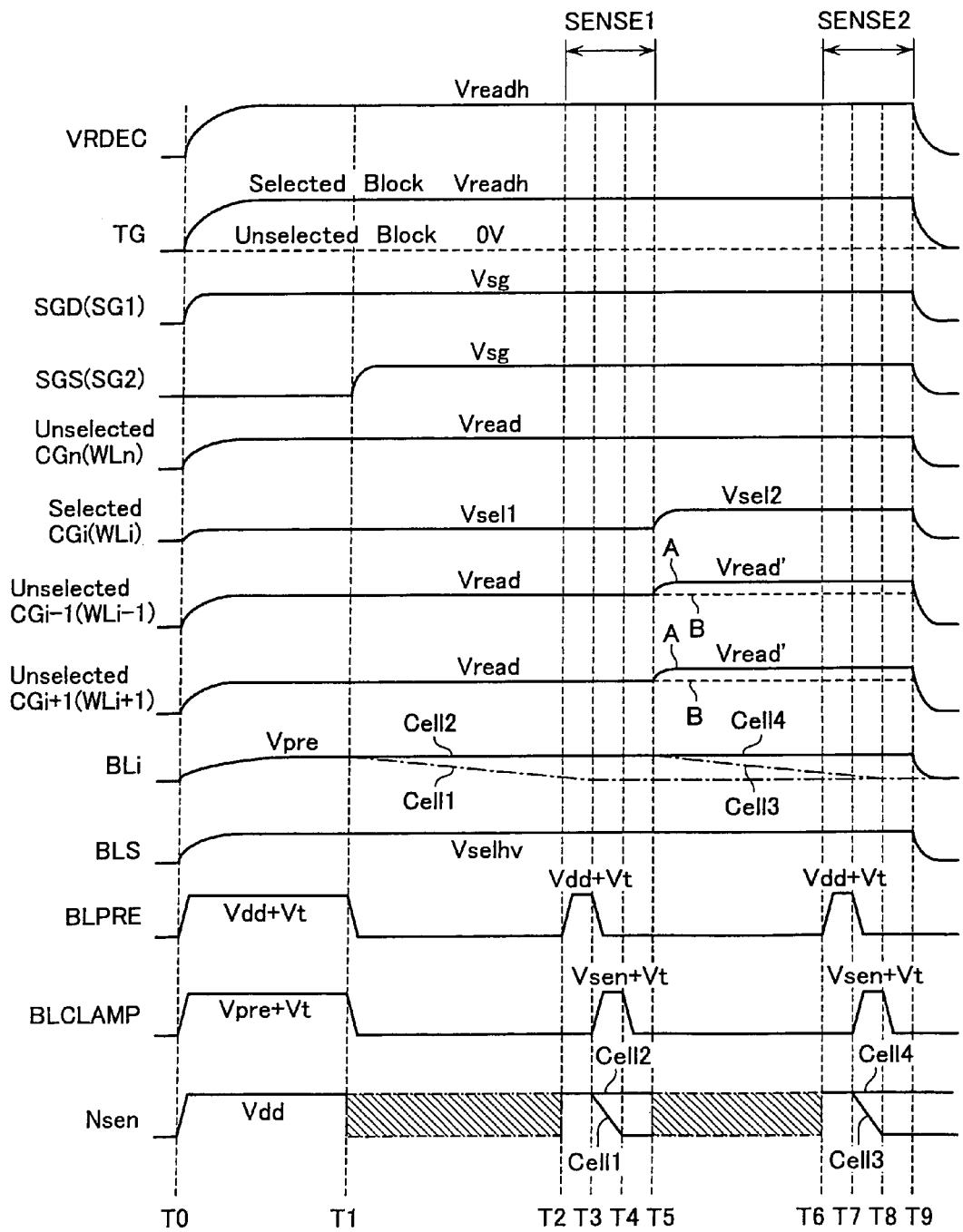
FIG. 16 shows a read timing chart with a word line drive scheme in accordance with this invention.

FIG. 16 shows a timing chart of a data read operation in accordance with this Embodiment 11. As read-use transferring voltage Vreadh, which is sufficiently higher than a read voltage applied to a selected word line, is output at the high voltage output node VRDEC at timing T0, this is applied to the gate TG of the transferring transistors 24 in a selected block via a selected block decoder. At the same time, voltage Vsg, which is selected to deeply turn on the select transistor TR1, is applied to the gate SG1 (i.e., drive signal line SGD) of select gate transistor TR1 disposed at bit line side; read voltage Vse11 to a selected word line WLi (i.e., drive signal line CGi); pass voltage Vpass, which is selected to turn on unselected cells without regard to unselected cell's threshold (cell's data), to adjacent-unselected word lines WLi−1, WLi+1 and the remaining word lines WLn. Further, at the same time, voltage Vselhv, which is selected so high as not to clamp the bit line voltage, is applied to the gate BLS of bit line selecting transistor 51; transfer-use voltage Vdd+Vt, which is used for transferring a voltage (e.g., Vdd) higher than bit line voltage to the gate BLPRE of precharging transistor 54; and voltage Vpre+Vt, which is for transferring bit line precharge voltage Vpre, to the gate BLCLAMP of clamping transistor 52. Here, Vt is a threshold voltage of transistors 52 and 54. With the above-described voltage application, precharge voltage Vpre is applied to the bit line BLi during T0-T1.

Turning off the precharging transistor 54 and clamping transistor 52 at timing T1, and simultaneously applying voltage Vsg, which is able to deeply turn on another select gate transistor TR2, to the gate SG2 thereof (i.e., drive signal line SGS), discharge operation of the bit line BLi starts in accordance with the threshold state (i.e., data state) of a selected memory cell MCi. In FIG. 16, bit line discharge waveforms are shown with respect to two data states "Cell1" and "Cell2" of the selected cell MCi. In case the threshold voltage of the selected cell MCi is lower than Vsel1, bit line voltage will be discharged as designated as data state "Cell1". If the threshold voltage is higher than Vsell1, the bit line is not discharged and held at Vpre as designated as data state "Cell2".

A period of from timing T2 to timing T5 serves for first data sense, SENSE1. During T2–T3, apply Vdd+Vt to the gate BLPRE again to turn on the precharging transistor 54, thereby precharging the sense node Nsen at Vdd. Following it, apply sense-use voltage Vsen+Vt to the gate BLCLAMP of the clamping transistor 52 at timing T3. If the bit line voltage at this time is lower than Vsen, the sense node Nsen will be discharged. By contrast, if the bit line voltage is higher than Vsen, the sense node Nsen is kept at precharged voltage Vdd. Therefore, the sense node Nsen becomes "L" in case of cell data Cell1, while the sense node Nsen becomes "H" in case of cell data Cell2. This sensed result is latched in the data latch 55 during T414 T 5.

At timing T5, change the read voltage, Vsel1, applied to the selected word line WLi to Vsel2. In addition, after this timing T5, cause the adjacent-unselected word lines WLi−1, WLi+1, which are disposed adjacent to the selected word line WLi, to be floating, and the data state Cell2, that has been determined as "H" in the first data sense SENSE1, will be classified into two data states Cell3 and Cell4 in correspondence with the cell's threshold. As shown in FIG. 16, the bit line is discharged in case of data state Cell3 with a threshold voltage lower than Vsel2, while the bit line is not discharged in case of data state Cell4 with a threshold voltage higher than Vsel2.

During T6–T9, second data sense SENSE2 is performed for distinguishing between data states Cell3 and Cell4 as similar to the first data sense SENSE1. The sensed result is latched in data latch 55. Note here that the sensed result of the first data sense SENSE1 is temporarily stored in the latch 55, and then transferred to another latch (not shown) prior to the second data sense SENSE2. After timing T9, perform discharge operations for discharging the selected word line and the like, and data read operation ends.

According to this Embodiment 11, adjacent-unselected word lines are set in an electrically floating state prior to the second data sense SENSE2 as similar to the above-described embodiments, thereby substantially decreasing the parasitic capacitance of the selected word line. Therefore, it is possible to lessen the rising-up time of the selected word line voltage when it is switched from Vsel1 to Vsel2. As a result, the bit line discharge time, that is defined as a period of T5-T6, for the second data sense SENSE2, may be shortened.

Note here that the adjacent-unselected word lines WLi−1, WLi+1 becomes to have, as shown by waveform A, a floating voltage Vread' higher than the pass voltage Vread after timing T5. In the conventional case, as shown by waveform B, the pass voltage Vread is continuously applied as it is. Voltage Vread' is determined by the difference between voltages Vsel1 and Vsel2 applied to the selected word line and the coupling capacitance between word lines. The voltage difference between Vsel1 and Vsel2 is about 3V in case of maximum. Supposing that ratio of coupling capacitance between word lines is about 30% of the entire capacitance of one word line, Vread'−Vread is about 1V in case of maximum.

If the read pass voltage Vread is too high, the problem is that read disturbance becomes large as to shift the negative threshold of unselected memory cells in the positive direction. Therefore, it is required to utilize the above-described read operation in accordance with this embodiment in a certain voltage range in which the above-described read disturbance is not so large as to get into trouble.

[Embodiment 12]

As an embodiment, an electric card using the non-volatile semiconductor memory devices according to the above-described Embodiments of the present invention and an electric device using the card will be described bellow.

Figure 22:
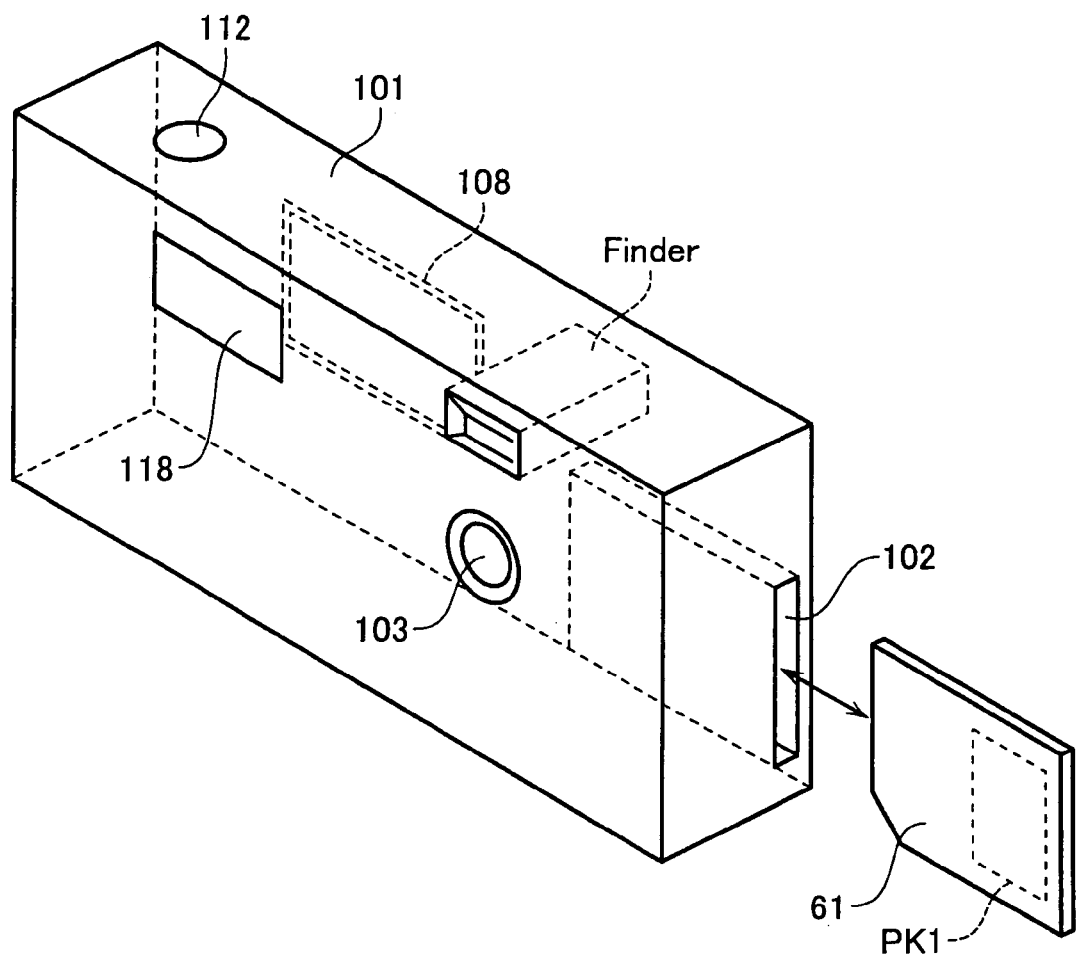
FIG. 22 shows an embodiment applied to a digital still camera.

FIG. 22 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 23:
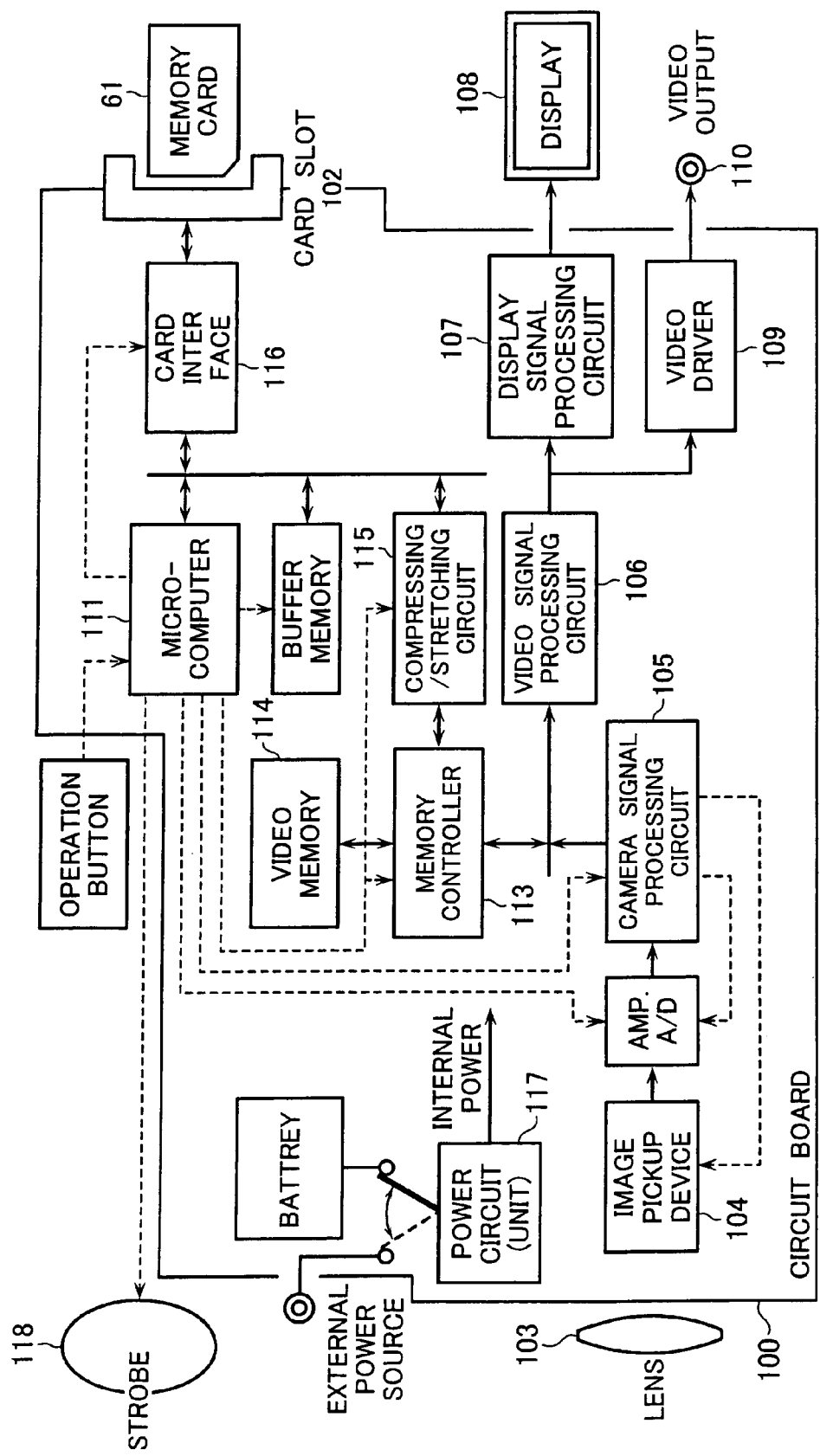
FIG. 23 shows an internal configuration of the digital still camera.
Figure 24A:
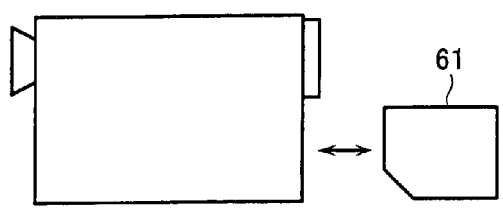
FIGS. 24A to 24J show other application devices in accordance with the present invention.
Figure 24F:
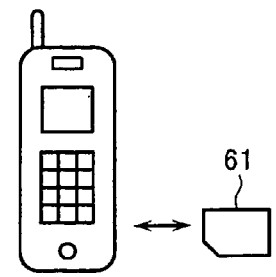
Figure 24B:
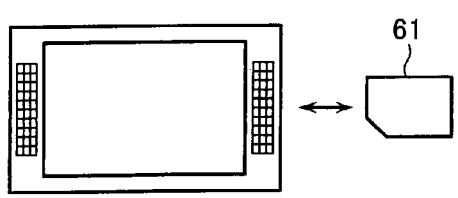
Figure 24G:
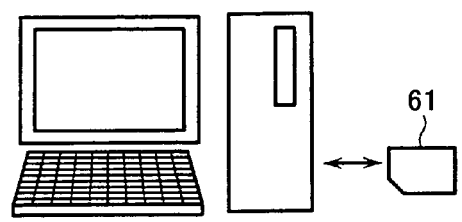
Figure 24C:
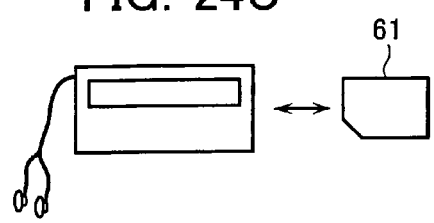
Figure 24H:
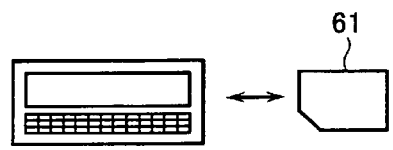
Figure 24D:
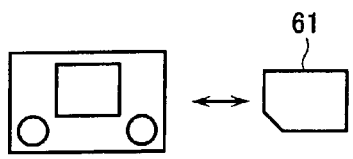
Figure 24I:
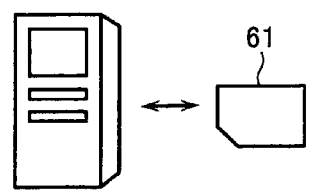
Figure 24E:
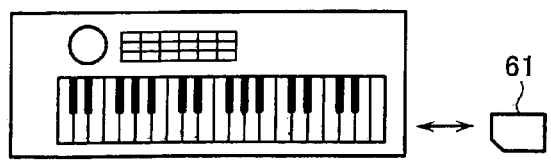
Figure 24J:
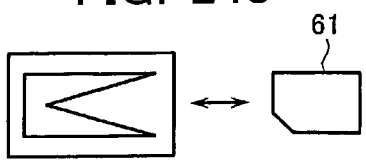

FIG. 23 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 24A to 24J, as well as in portable electric devices. That is, the electric card can also be used in a video camera shown in FIG. 24A, a television set shown in FIG. 24B, an audio apparatus shown in FIG. 24C, a game apparatus shown in FIG. 24D, an electric musical instrument shown in FIG. 24E, a cell phone shown in FIG. 24F, a personal computer shown in FIG. 24G, a personal digital assistant (PDA) shown in FIG. 24H, a voice recorder shown in FIG. 24I, and a PC card shown in FIG. 24J.

What is claimed is:

1. A semiconductor memory device comprising:
   a memory cell array having word lines and bit lines disposed to cross each other, and memory cells disposed at crossings thereof; and
   a word line drive circuit configured to set at least one of unselected word lines in an electrically floating state while driving a selected word line, based on input address and control signals output,
   wherein said word line drive circuit is configured to apply a write voltage to a selected word line in a selected block in a data write mode while setting at least one of two unselected word lines adjacent to the selected word line in an electrically floating state, and to apply a write pass voltage to at least one of the remaining word lines in the selected block, the write pass voltage being set as to turn on memory cells without regard to cell data.

2. The semiconductor memory device according to claim 1, wherein said memory cell array comprises NAND cell units arranged therein, each NAND cell unit including a plurality of electrically rewritable and non-volatile memory cells connected in series and driven by different word lines, said memory cell array being divided into plural blocks each defined as a group of NAND cell units arranged in the direction of said word lines.

3. The semiconductor memory device according to claim 1, wherein
   said word line drive circuit is configured to set two unselected word lines adjacent to the selected word line in the electrically floating state before applying the write voltage to the selected word line.

4. The semiconductor memory device according to claim 1, wherein
   said word line drive circuit is configured to raise the write pass voltage in advance of the write voltage, and set the selected word line in an electrically floating state from rising of the write pass voltage to rising of the write voltage.

5. The semiconductor memory device according to claim 2, wherein
   said word line drive circuit is configured to apply a write voltage to a selected word line in a selected block in a data write mode while setting first and second unselected word lines adjacent to the selected word line in an electrically floating state, applying to apply 0V to third and fourth unselected word lines adjacent to the first and second unselected word lines respectively, and to apply a write pass voltage to at least one of the remaining word lines in the selected block, the write pass voltage being selected as to turn on memory cells without regard to cell data.

6. The semiconductor memory device according to claim 2, wherein
   said word line drive circuit is configured to apply a write voltage to a selected word line in a selected block in a data write mode, while setting first and second unselected word lines adjacent to the selected word line in an electrically floating state; apply 0V to one of third and fourth unselected word lines adjacent to the first and second unselected word lines respectively and a write pass voltage to the other, the write pass voltage being set as to turn on memory cells without regard to cell data; and to apply the write pass voltage to the remaining word lines in the selected block.

7. The semiconductor memory device according to claim 2, wherein
   said word line drive circuit is configured to apply a write voltage to a selected word line in a selected block in a data write mode, while setting one of first and second unselected word lines adjacent to the selected word line in an electrically floating state and to apply a certain voltage to the other; to apply 0V to one of third and fourth unselected word lines adjacent to the first and second unselected word lines respectively and a write pass voltage to the other, the write pass voltage being selected as to turn on memory cells without regard to cell data; and to apply the write pass voltage to at least one of the remaining word lines in the selected block.

8. The semiconductor memory device according to claim 2, wherein said word line drive circuit comprises:

a block decoder configured to select a block in said memory cell array;

word line drivers configured to output driving signals to be transferred to the respective word lines in a selected block; and transferring transistors having a common gate, and driven by the output of said block decoder to transfer the driving signals output from said word line drivers to the respective word lines in the selected block.

9. The semiconductor memory device according to claim 8, wherein drive signal lines disposed between said word line drivers and said transferring transistors are formed to cross each other at least in part.

10. The semiconductor memory device according to claim 8, wherein each said word line driver has a voltage limiter connected to an output node thereof and activated when the output node is set in an electrically floating state.

11. The semiconductor memory device according to claim 2, wherein said device has a data read mode with first and second data sense operations performed with different data judging conditions from each other in first and second periods respectively, through which bit line voltage varies in accordance with a selected memory cell's data, and wherein a first read voltage is applied to a selected word line in a selected block, while a read pass voltage is applied to unselected word lines in the selected block, the read pass voltage being selected as to turn on memory cells without regard to cell data, in the first period; and the first read voltage is changed to a second read voltage, while two unselected word lines adjacent to the selected word line are set in an electrically floating state in the second period.

12. An electric card equipped with a semiconductor memory device, said device comprising:

a memory cell array having word lines and bit lines disposed to cross each other, and memory cells disposed at crossings thereof; and a word line drive circuit configured to set at least one of two unselected word lines adjacent to a selected word line in an electrically floating state, while driving the selected word line, based on input address and control signals output, wherein said word line drive circuit is configured to apply a write voltage to a selected word line in a selected block in a data write mode while setting at least one of two unselected word lines adjacent to the selected word line in an electrically floating state, and to apply a write pass voltage to at least one of the remaining word lines in the selected block, the write pass voltage being set as to turn on memory cells without regard to cell data.

13. An electric device comprising:

a card interface;

a card slot connected to said card interface; and an electric card defined in claim 12 and electrically connectable to said card slot.

14. The electric device according to claim 13, wherein said electric device is a digital still camera.

15. The semiconductor memory device according to claim 13, wherein said electric device is a digital still camera.

16. The electric card according to claim 12, further comprising a controller configured to control operation of said memory cell array.

* * * * *